(12) United States Patent
Edman et al.

(10) Patent No.: US 10,892,434 B2
(45) Date of Patent: Jan. 12, 2021

(54) LIGHT-EMITTING ELECTROCHEMICAL CELL

(71) Applicant: LunaLEC AB, Umea (SE)

(72) Inventors: Ludvig Edman, Umea (SE); Martijn Kemerink, Linkoping (SE); Andreas Sandstrom, Umea (SE); Shi Tang, Umea (SE)

(73) Assignee: LUNALEC AB, Umea (SE)

( * ) Notice: Subject to any disclaimer, the term of this patent is extended or adjusted under 35 U.S.C. 154(b) by 47 days.

(21) Appl. No.: 16/477,879

(22) PCT Filed: Jan. 18, 2017

(86) PCT No.: PCT/EP2017/050979
§ 371 (c)(1),
(2) Date: Jul. 13, 2019

(87) PCT Pub. No.: WO2018/133930
PCT Pub. Date: Jul. 26, 2018

(65) Prior Publication Data
US 2019/0372046 A1 Dec. 5, 2019

(51) Int. Cl.
*H01L 51/50* (2006.01)
*H01L 51/00* (2006.01)
(Continued)

(52) U.S. Cl.
CPC ...... *H01L 51/5032* (2013.01); *H01L 51/0003* (2013.01); *H01L 51/5004* (2013.01);
(Continued)

(58) Field of Classification Search
CPC ............. H01L 51/5032; H01L 51/0003; H01L 51/5004; H01L 51/5016; H01L 51/5203;
(Continued)

(56) References Cited

U.S. PATENT DOCUMENTS

| | | | |
|---|---|---|---|
| 8,795,852 B2* | 8/2014 | Asari | H01L 51/0067 428/690 |
| 2009/0050199 A1* | 2/2009 | Bartholomew | H01L 51/5032 136/256 |
| 2018/0358568 A1* | 12/2018 | Luan | H01L 51/0023 |

OTHER PUBLICATIONS

Nature Communications vol. 10, Article No. 5307 (2019) (Year: 2019).*
(Continued)

*Primary Examiner* — Jarrett J Stark
(74) *Attorney, Agent, or Firm* — Hultquist, PLLC; Steven J. Hultquist

(57) ABSTRACT

A light-emitting electrochemical cell comprising a first electrode, a second electrode, and at least one light-emitting active material comprising a combination of an electrolyte, a first constituent comprising a host compound and a second constituent comprising a guest compound. A quotient between a difference in LUMO energy level between the first and second constituent, $E_{trap}^{n}$, and a difference in HOMO energy level between the second and first constituent, $E_{trap}^{p}$, is $\frac{1}{10}$ to 10, a quotient between an electron mobility and a hole mobility on the first constituent is $\frac{1}{100}$ to 100, a quotient between a number of ions of the electrolyte and a number of molecules or repeat units of the second constituent is $\frac{1}{3}$ to 5, and a LUMO energy level of the electrolyte is higher than the LUMO energy level of the first constituent and a HOMO energy level of the electrolyte is lower than the HOMO energy level of the first constituent.

26 Claims, 17 Drawing Sheets

(51) Int. Cl.
  *H01L 51/52* (2006.01)
  *H01L 21/02* (2006.01)
(52) U.S. Cl.
  CPC ...... *H01L 51/5016* (2013.01); *H01L 51/5203* (2013.01); *H01L 21/02282* (2013.01); *H01L 51/5253* (2013.01); *H01L 2251/55* (2013.01); *H01L 2251/552* (2013.01)
(58) Field of Classification Search
  CPC ........... H01L 51/5253; H01L 21/02282; H01L 2251/55; H01L 2251/552
  See application file for complete search history.

(56) References Cited

OTHER PUBLICATIONS

Tang, S., et al., "On the Selection of a Host Compound for Efficient Host-Guest Light-Emitting Electrochemical Cells", "J. Mater. Chem. C", 2015, pp. 8114-8120, vol. 3.

Tang, S., et al., "White Light From a Light-Emitting Electrochemical Cell: Controlling the Energy-Transfer in a Conjugated Polymer/Triplet-Emitter Blend", "Applied Materials and Interfaces", 2015, pp. 25955-25960.

\* cited by examiner

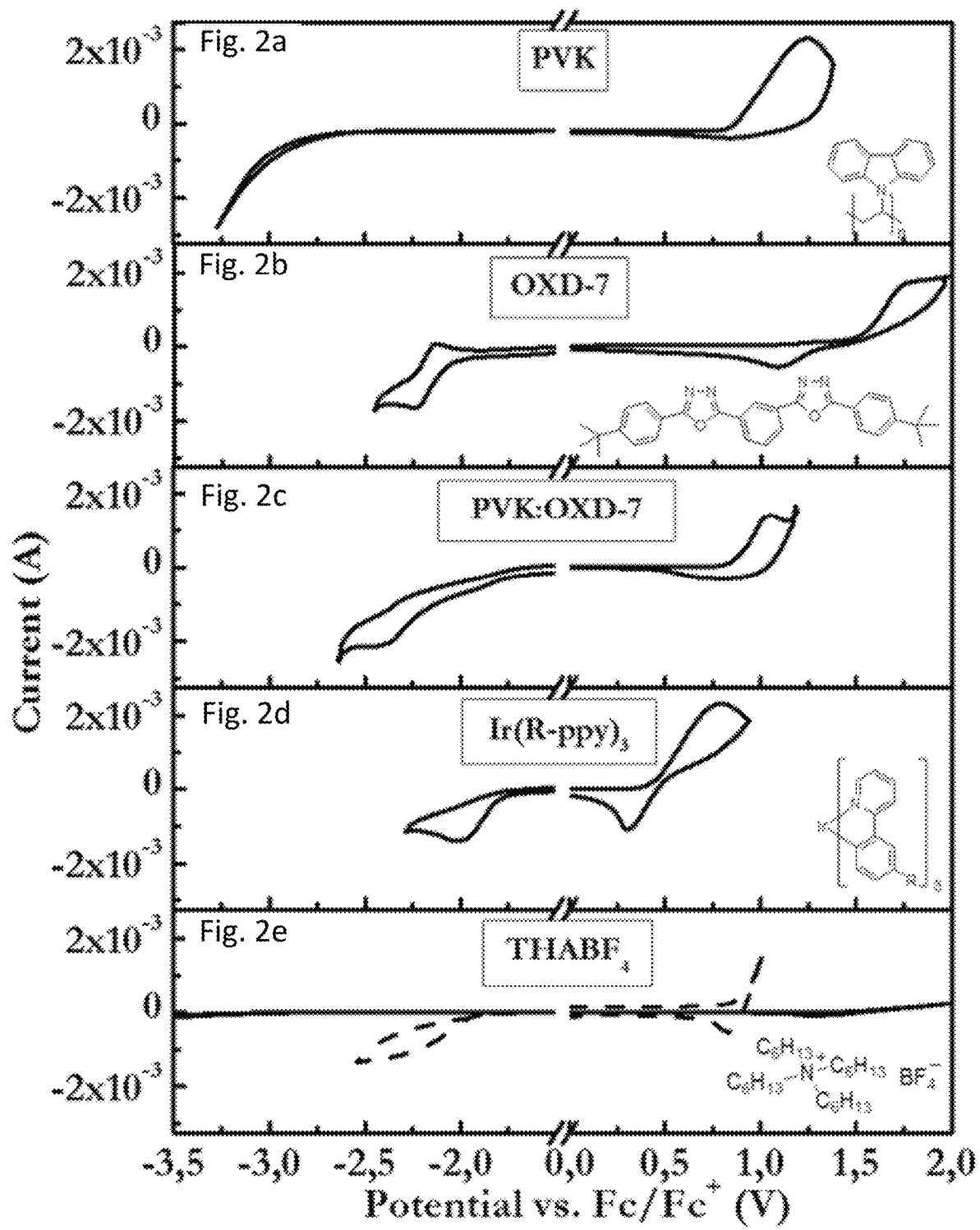

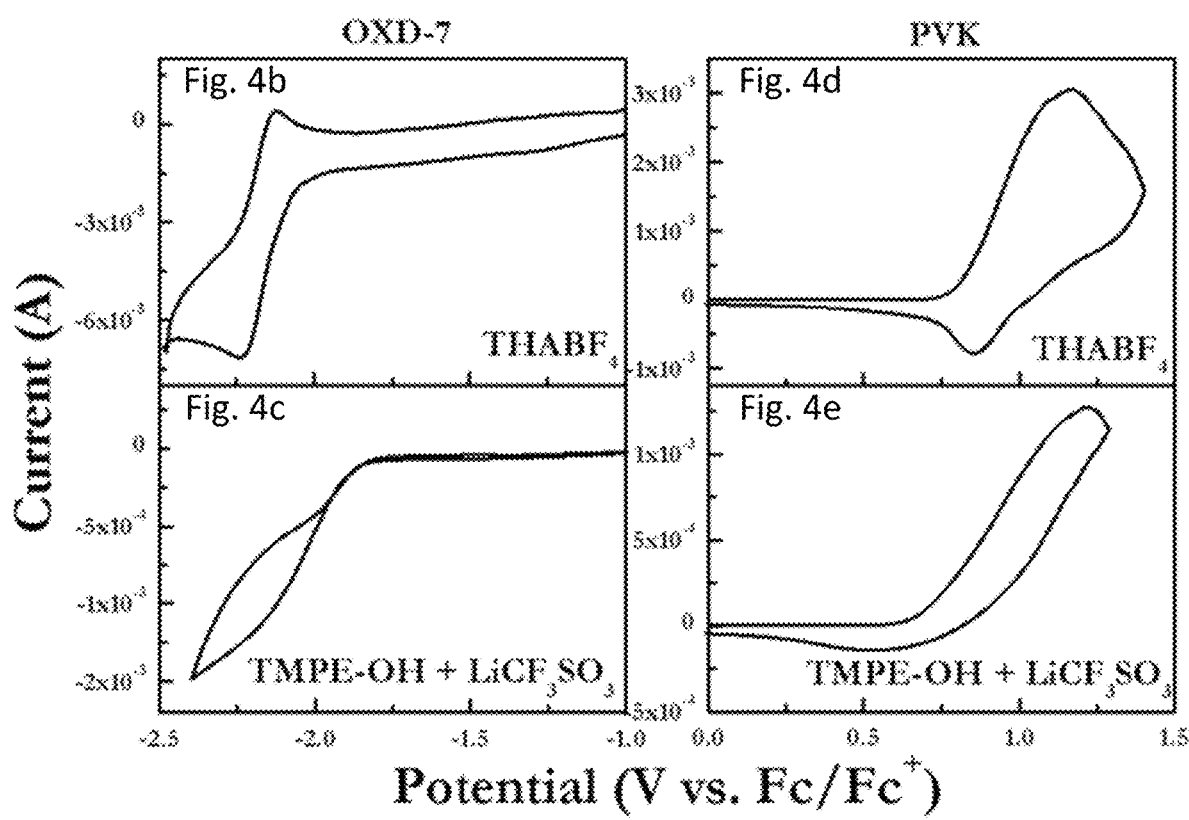

| Host | Guest | Electrolyte | CIE (x, y) | Bipolar doping | Trap symmetry ($E^p_{trap}/E^n_{trap}$) | Mobility symmetry | Luminance (cd/m²) | Efficiency at peak Luminance (cd/A) | EQE (%) |
|---|---|---|---|---|---|---|---|---|---|
| PVK:OXD-7 | Ir(R-ppy)₃ | THABF₄ | 0.30, 0.60 | Yes | 0.32/0.38 | Yes | 3,250 | 42.2 | 11.7 |
| PVK | Ir(R-ppy)₃ | THABF₄ | 0.30, 0.60 | No | −/0.38 | No | 575 | 7.5 | 2.1 |
| OXD-7 | Ir(R-ppy)₃ | THABF₄ | 0.30, 0.60 | Yes | 0.32/1.06 | No | 290 | 3.7 | 1.0 |
| PVK:OXD-7 | Ir(R-ppy)₃ | TMPE-OH: LiCF₃SO₃ | 0.30, 0.60 | No | 0.32/0.38 | Yes | 315 | 4.0 | 1.1 |
| PVK:OXD-7 | Ir(mppy)₃ | THABF₄ | 0.32, 0.63 | Yes | 0.06/0.23 | Yes | 1,890 | 24.6 | 6.9 |
| PVK:OXD-7 | Hex-Ir(piq)₃ | THABF₄ | 0.68, 0.32 | Yes | 0.14/0.54 | Yes | 302 | 3.9 | 4.9 |
| TH123:TH105 | Ir(R-ppy)₃ | THABF₄ | 0.30, 0.60 | Yes | 0.33/0.57 | Yes | 2,100 | 27.4 | 7.6 |

Fig. 7

Ten filed Jan. 18, 2017. The disclosure of Interna-# LIGHT-EMITTING ELECTROCHEMICAL CELL

CROSS-REFERENCE TO RELATED APPLICATION

This is a U.S. national phase under the provisions of 35 U.S.C. § 371 of International Patent Application No. PCT/EP17/50979 filed Jan. 18, 2017. The disclosure of International Patent Application No. PCT/EP17/50979 is hereby incorporated herein by reference in its entirety, for all purposes.

TECHNICAL FIELD

The present disclosure relates to a light-emitting electrochemical cell, a method for producing a light-emitting electrochemical cell and a method of operating a light-emitting electrochemical cell.

BACKGROUND

A light-emitting electrochemical cell (LEC) is a thin-film device, which in a common manifestation features a single-layer active material sandwiched between two air-stable electrodes.

The characteristic feature of the LEC, which distinguishes it from the more commonplace organic light-emitting diode (OLED), is the presence of mobile ions in the active material. When a voltage is applied between the electrodes, these ions redistribute to enable in-situ electrochemical doping of the organic semiconductor: p-type at the anode and n-type at the cathode; after a turn-on time, a p-n junction has formed in the active material. This dynamic doping mode allows for large and balanced electron and hole currents, and a high recombination rate of electrons and holes into excitons. Unfortunately, it also brings a challenge, since the exciton will be quenched when it impinges upon an electron or a hole (commonly termed "polarons"), and this exciton-polaron quenching is severe in LEC devices—to such a degree that it has been argued that high brightness (or luminance) and high efficiency are mutually exclusive.

The issue of exciton-polaron quenching has been addressed in triplet-emitting OLEDs through the design of a sophisticated device architecture comprising a multitude of different layers, where each layer has a specific task and an exact thickness on the nm-level. The central emitting layer is of a host-guest character, where the exciton is trapped on a triplet-emitting guest. This complex and exact device architecture is fabricated by sequential vapor deposition under high vacuum, and is as such not compatible with the simplicity of the LEC concept.

Tang et. al, *On the selection of a host compound for efficient host-guest light-emitting electrochemical cells*", J. Mat. Chem. C, 2015, 3, 8114, reports a light-electrochemical cell with a host-guest active material wherein the host material selected can be electrochemically p- and n-type doped and thereby result in LECs with improved luminance and efficiency: the current efficiency was 2.5 cd/A (corresponding to an external quantum efficiency of 1.9%) at a luminance of 2000 cd m$^{-2}$. Other host-guest LEC architectures have resulted in a wide variety of emission colors, but none of these devices has surpassed an efficiency of 10 cd/A at a luminance larger than 100 cd/m$^2$ during steady-state operation.

Thus, the critical issue of delivering efficient operation at high luminance from a LEC device remains.

SUMMARY

An object of the present disclosure is, hence, to provide an improved light-emitting electrochemical cell, in particular a light-emitting electrochemical cell with an improved operation efficiency at high luminance. Objects are also to provide a method of producing a light-emitting electrochemical cell and to provide a method of operating a light-emitting electrochemical cell.

The invention is defined by the appended independent claims. Embodiments are set forth in the appended dependent claims and in the figures.

According to a first aspect, there is provided a light-emitting electrochemical cell comprising a first electrode, a second electrode, and at least one light-emitting active material separating the first and second electrodes, wherein the light-emitting active material comprises a combination of an electrolyte, a first constituent comprising a host compound and a second constituent comprising a guest compound. A quotient between a difference in LUMO energy level between the first and second constituent, $E_{trap}^{n}$, and a difference in HOMO energy level between the second and first constituent, $E_{trap}^{p}$, is $\frac{1}{10}$ to 10, a quotient between an electron mobility and a hole mobility on the first constituent is $\frac{1}{100}$ to 100, a quotient between a number of ions of the electrolyte and a number of molecules or repeat units of the second constituent is $\frac{1}{3}$ to 5, and a LUMO energy level of the electrolyte is higher than the LUMO energy level of the first constituent and a HOMO energy level of the electrolyte is lower than the HOMO energy level of the first constituent.

The at least one light-emitting active material layer separating the first and second electrodes may be in direct contact or indirect contact, i.e. via another layer, with the first and second electrodes. In any event, the electrodes are in operative contact with the active material, such that charge transfer from the electrodes to the active material is possible.

The first constituent of the active material comprises at least one host compound (e.g. 1-5, 1-4, 1-3 or 1-2 different host compounds). The first constituent may consist essentially of one or more host compounds. The first constituent may consist of one or more host compounds.

A host compound is here defined as a semiconducting compound that can be used for electronic charge transport. The energy gap of the host should be larger than the energy gap of the second constituent. Preferably, the LUMO energy level of the host should be higher than the LUMO energy level of the second constituent, and the HOMO energy level of the host should be lower than the HOMO of the second constituent.

As said above, the second constituent comprises a guest compound.

Typically, the second constituent consists of one guest compound and the first constituent consists of one or two host compounds.

A guest compound is here defined as a semiconducting compound, which exists in a smaller number than the first constituent (i.e. the host(s)) in the active material. The energy gap of the guest should be smaller than the energy gap of the first constituent (i.e. the host(s)). Preferably, the LUMO energy level of the second constituent, the guest compound, should be lower than the LUMO energy level of the first constituent, and the HOMO energy level of the second constituent should be higher than the HOMO energy level of the first constituent.

The electrolyte of the active material may comprise a mixture of one or more electrolytes (e.g. 1-5, 1-4, 1-3 or 1-2 different electrolytes).

The LUMO and HOMO energy levels of different first and second constituents and electrolytes can be measured with e.g. cyclic voltammetry. Thus, the determination of a LUMO or HOMO level for a particular material is within the common general knowledge of a skilled person. As used herein, a first LUMO (i.e. the lowest unoccupied molecular orbital) or HOMO (i.e. the highest occupied molecular orbital) energy level are "higher than" or "above" a second LUMO or HOMO energy level if the first energy level is closer to the vacuum energy level. The LUMO and HOMO energy levels of the first and second constituents and the electrolyte are effective LUMO and HOMO energy levels.

When the first constituent comprises more than one host compound the LUMO energy level of the first constituent is the LUMO energy level of the host compound with the lowest LUMO energy level.

When the first constituent comprises more than one host compound the HOMO energy level of the first constituent is the HOMO energy level of the host compound with the highest HOMO energy level.

The second constituent has a smaller energy gap, i.e. the difference between the LUMO energy level and the HOMO energy level, than the first constituent, i.e. there can be an efficient energy transfer from the first constituent to the second constituent.

The second constituent should act as an electron, hole and exciton trap when combined with a first-constituent matrix, such that there should not be an efficient energy transfer from the second constituent to the first constituent.

The LUMO and HOMO energy levels of the first constituent and second constituent should be such that the electron trap depth and the hole trap depth are symmetric, and $E_{trap}^{n}/E_{trap}^{p}$ should be between 0.1 to 10.

The electron, hole and exciton traps are commonly called guest traps.

With "combination" or "blend" is here meant that in the light-emitting active material the second constituent is dispersed in the first-constituent matrix on a molecular level, or combined into a larger molecule by a chemical bond. During steady-state operation there is emission essentially only from the second constituent, as may be confirmed by photoluminescence (PL) and electroluminescence (EL) measurements.

The electrolyte should be electrochemically inert during LEC operation, that is, the preferred electrochemical reactions during LEC operation should be p-type doping (oxidation) and n-type doping (reduction) of the first constituent and the second constituent, and not electrochemical oxidation or reduction of the electrolyte. This property can be further explained in that the LUMO of the electrolyte should be higher than the LUMO of the first constituent, and the HOMO of the electrolyte should be lower than the HOMO of the first constituent. It is preferable if the LUMO level of the electrolyte is higher than the LUMO level of the first constituent by 0.1 eV or more, and that the HOMO level of the electrolyte is lower than the HOMO level of the first constituent by 0.1 eV or more.

This "inertness" feature can be measured with e.g. cyclic voltammetry and is verifiable in that the voltage will decrease and the luminance increase during the initial device operation at constant-current bias.

The mobility $\mu_n$ of the electrons on the first constituent and the mobility $\mu_p$ of the holes on the first constituent should be approximately symmetric, preferably the ratio B between $\mu_n$ and $\mu_p$ should be 0.01<B<100.

The mobility can be measured with e.g. time-of-flight measurements.

This light-emitting active material is designed so that the guest traps are compensated by electrolyte ions through doping in the transport (doping) regions next to the electrodes during the steady-state operation of the LEC.

Furthermore, this light-emitting active material is designed so that an emission zone exists in between the transport regions during steady-state operation, where efficient emission is stemming from excitons localized and effectively immobilized on non-compensated guest traps.

As the quotient between the number of ions of the electrolyte and the number of molecules or repeat units of the second constituent is ⅓ to 5 to compensate for guest traps in the transport regions of the active material, the electrolyte concentration in the active material is higher than what is normally used in high-performance LECs.

With repeat unit is here meant a part of a polymer whose repetition would produce the complete polymer chain (except for the end-groups) by linking the repeat units together successively along the chain in a linear or branched fashion. The polymer can also comprise two or more different repeat units, which are linked together in a random order in a linear or branched fashion.

Hybrid polymers having both first constituent repeat units and second constituent repeat units can be created. Quotients between first and second constituent should then consider the number of repeat units of the first constituent and the number of repeat units of the second constituent.

Hybrid polymers having first or second constituent repeat units and electrolyte repeat units can be created. Quotients between the second constituent and the number of ions should then consider the number of repeat units of the second constituent and the number of ions.

Hybrid polymers having first or second constituent repeat units, or electrolyte repeat units, and other influencing repeat units to improve device functionality e.g. by increasing viscosity of ink, improving optical properties, and alleviating phase separation, can be created. Such other influencing repeat units should not be seen as first constituent, second constituent or as electrolyte.

During steady-state operation of the LEC, the first and second constituents are electrochemically p-type doped in a p-type transport region next to the anode, and n-type doped in an n-type transport region next to the cathode and the first constituent and the second constituent support significant electrochemical p-type and n-type doping. This is verifiable with e.g. cyclic voltammetry.

In one embodiment of the present light-emitting electrochemical cell, there is a significant trapping of charge carriers, with a trap depth $E_{trap}^{n}$ and $E_{trap}^{p}$ of at least 0.1 eV, and a trap concentration $c_{trap}$ equal to at least 0.02 $(nm)^{-3}$.

During steady-state operation, essentially all traps in the p-type and n-type transport regions are filled by electrochemical doping, so that significant hole and electron currents can be supported at low overpotential ("voltage loss"). Moreover, essentially all emission is originating from immobile excitons on guest traps in an "undoped" region in between the p-type and n-type region (the p-n junction), so that the exciton (the precursor of a photon) and electron/hole polaron populations are effectively separated. This is important since the electron/hole polaron is effective in quenching the exciton. This is verifiable by e.g. numerical simulation.

This desired operation is effectuated by that the electron and hole trap depths are similar in size, i.e. a quotient between a difference in LUMO energy level between the first and second constituent and a difference in HOMO energy level between the second and first constituent is 1/10 to 10.

When a light-emitting active material of a LEC has a symmetric electron trap depth and hole trap depth, a symmetric mobility on the first constituent, the electrolyte is electrochemically inert, and the quotient between the number of ions of the electrolyte and the number of molecules or repeat units of the second constituent is selected such that the guest traps are filled (or doped) in the transport regions next to the electrodes but non-filled (or non-doped) in the central emission region, the electron-to-photon external quantum efficiency of the resulting LEC device is above 4% when subjected to a current density of at least 50 A/m². Such a high efficiency at a high current density has not previously been reported for LEC devices. It has long been considered impossible to attain high luminance at high efficiency from a LEC since efficiency-quenching exciton-polaron interactions typically are prominent at high luminance, but here these quenching interactions are suppressed by the separation of the doping and the light emission.

If the symmetry of the electron trap depth and the hole trap depth and/or the symmetry of the hole and electron mobility on the first constituent is lowered the efficiency of the obtained LEC is reduced.

During steady-state operation, essentially all emission is originating from the second constituent in the p-n junction region. If the second constituent is a triplet emitter, efficient triplet emission can be attained. This is e.g. verifiable with a combination of photoluminescence and electroluminescence.

With the present LEC more than 50%, or 60%, or 70%, or 80%, or 90%, or 95% or more than 99% of photons emitted during operation thereof may be emitted from the second constituent.

The origin of a photon can be decided by comparing the electroluminescence spectrum of the device with the photoluminescence spectra of pure films of the first and second constituents.

The quotient between the difference in LUMO energy between the first and second constituent and the difference in HOMO energy between the second and first constituent of the light-emitting active material may be 1/9 to 9, preferably 1/8 to 8, 1/7 to 7, 1/6 to 6, 1/5 to 5, 1/4 to 4, 1/3 to 3, 1/2 to 2, 2/3 to 3/2, or 4/5 to 5/4.

Most preferably, the quotient may be close to 1.

The quotient between the electron mobility and the hole mobility on the first constituent in the light-emitting active material may be 1/50 to 50, preferably 1/20 to 20, 1/10 to 10, 1/8 to 8, 1/6 to 6, 1/4 to 4, 1/3 to 3, 1/2 to 2, 2/3 to 3/2, or 4/5 to 5/4.

Most preferably, the quotient may be close to 1.

The quotient between the number of ions of the electrolyte and the number of molecules or repeat units of the second constituent may be 0.5 to 4, preferably 0.6 to 3, 0.7 to 2.5, 0.8 to 2.0, 0.9 to 1.8, 1.0 to 1.6, or 1.1 to 1.4.

In the following, non-limiting example compositions of some different light-emitting active materials are listed.

In a first example of the active material, the quotient between the electron trap depth and the hole trap depth $E_{trap}^{n}/E_{trap}^{p}$, is 0.8 to 0.9, the quotient between electron mobility and hole mobility on the first constituent is 0.1 to 10, and the quotient between the number of ions of the electrolyte and the number of molecules or repeat units of the second constituent is 1.1 to 1.4 This results in an external quantum efficiency of 11.7% at a drive current density of 7.7 mA/cm². The first constituent could be a combination of PVK and OXD-7, the second constituent could be Ir(R-ppy)₃. The electrolyte could be THABF₄.

In a second example of the active material, the quotient between the electron trap depth and the hole trap depth $E_{trap}^{n}/E_{trap}^{p}$ is 0.5 to 0.6, the quotient between electron mobility and hole mobility on the first constituent is 0.1 to 10 and the quotient between the number of ions of the electrolyte and the number of molecules or repeat units of the second constituent is 1.1 to 1.3. This results in an external quantum efficiency of 7.6% at a drive current density of 7.7 mA/cm². The first constituent could be a combination of TH123 and TH105, the second constituent could be Ir(R-ppy)₃. The electrolyte could be THABF₄.

In a third example of the active material, the quotient between the electron trap depth and the hole trap depth $E_{trap}^{n}/E_{trap}^{p}$ is 0.2 to 0.3, the quotient between electron mobility and hole mobility on the first constituent is 0.1 to 10, and the quotient between the number of ions of the electrolyte and the number of molecules or repeat units of the second constituent is 1.0 to 1.2. This results in an external quantum efficiency of 6.9% at a drive current density of 7.7 mA/cm². The first constituent could be a combination of PVK and OXD-7, the second constituent could be Ir(mppy)₃. The electrolyte could be THABF₄.

In a fourth example of the active material, the quotient between the electron trap depth and the hole trap depth $E_{trap}^{n}/E_{trap}^{p}$ is 0.2 to 0.3, the quotient between electron mobility and hole mobility on the first constituent is 0.1 to 10, and the quotient between the number of ions of the electrolyte and the number of molecules or repeat units of the second constituent is 0.9 to 1.1. This results in an external quantum efficiency of 4.9% at a drive current density of 7.7 mA/cm². The first constituent could be a combination of PVK and OXD-7, the second constituent could be Hex-Ir(piq)₃. The electrolyte could be THABF₄.

A difference in energy gap, i.e. a difference between the LUMO energy level and the HOMO energy level, between the first and second constituent may be 0.1 eV-1.5 eV, preferably 0.2 eV-1.5 eV, or 0.5 eV-1 eV.

In one embodiment, the difference in energy gap may be 0.7 eV.

A quotient between the number of molecules or repeat units of the first constituent and the number of molecules or repeat units of the second constituent may be in a range between 300 and 1, preferably between 100 and 3, or 50 and 4, or 20 and 5.

In one embodiment the (first constituent:second constituent:electrolyte) mass stoichiometry is (64.6:29.0:6.4), which corresponds to a quotient between the number of molecules or repeat units of the first constituent and the number of molecules or repeat units of the second constituent of 10. The first constituent could be a combination of PVK and OXD-7, the second constituent could be Ir(R-ppy)₃ and the electrolyte could be THABF₄.

A thickness of the light-emitting active material layer may be 50-2000 nm, preferably 80-1000 nm, 90-700 nm, 100-150 nm or 125-135 nm.

In one embodiment, a film thickness of 130 nm may be used.

The first constituent of the light-emitting active material may comprise at least one solution-processable semiconductor.

With solution-processable is here meant that the semiconductor may be applied on a surface in liquid or viscous form and dried or cured on the surface.

The at least one solution-processable semiconductor may be selected from a group comprising polymers, oligomers, small molecules, and neutral and ionic transition metal complexes.

With small molecule is here meant any organic material that is not a polymer or oligomer, and small molecules may actually be quite large The small molecule may e.g. be 1,3-bis[2-(4-tert-butylphenyl)-1,3,4-oxadiazo-5-yl]benzene or 2-(4-tert-butylphenyl)-5-(4-biphenylyl)-1,3,4-oxadiazole.

The polymer(s) may be selected from a group comprising poly(carbazole), poly(para-phenylene), poly(para-phenylene vinylene), poly(fluorene) and neutral and ionic derivatives thereof, and any type of co-polymer structure thereof.

The polymer may e.g. be poly(9-vinylcarbazole).

The oligomer may e.g. be a triphenylamine or a carbazole-diaryloxadiazole.

The second constituent of the light-emitting active material may comprise at least one emissive solution-processable semiconductor.

With emissive is here meant that the semiconductor features a photoluminescence quantum efficiency exceeding 0.1% when combined (or dispersed) in an appropriate first-constituent matrix. With appropriate first-constituent matrix is meant a first constituent that allows efficient energy transfer to the second constituent in that more than 50% of the emitted photons from the device originate from the second constituent.

The at least one emissive solution-processable semiconductor may feature triplet emission and may be selected from a group comprising neutral and ionic transition metal complexes, quantum dots, polymers, oligomers, and small molecules.

That the second constituent features triplet emission is here meant that the material features phosphorescence with a photoluminescence quantum efficiency exceeding 0.1% when combined (or dispersed) in an appropriate first-constituent matrix.

The neutral transition metal complex may e.g. be Ir(R-ppy)$_3$, Tris[2-phenylpyridine]iridium, Tris[2-(p-tolyl)pyridine]iridium(III), Tris[(4-n-hexylphenyl)isoquinoline]iridium(III) or bis[(4,6-difluorophenyl)-pyridinato-N,C$^{2'}$]c(picolinate)iridium(III).

The ionic transition metal complex may e.g. be X(Y)$_3^{2+}$ (Z$^-$)$_2$, wherein X may be Ir or Ru, Y may be 2,2'-bipyridine, and Z$^-$ may be a molecular anion such as ClO$_4^-$ or PF$_6^-$, or combination thereof.

The quantum dots may e.g. be CdSe/ZnS quantum dots or InP/ZnS quantum dots.

The electrolyte may be selected from a group comprising ionic liquids, salts dissolved in an ion-solvating material, and ionic transition metal complexes.

The ionic liquid may e.g. be tetrahexylammonium tetrafluoroborate. The salts may be LiCF$_3$SO$_3$ or KCF$_3$SO$_3$ The ion-solvating materials may e.g. be poly(ethylene oxide) or hydroxyl-capped trimethylolpropane ethoxylate.

The ionic transition metal complex may e.g. be X(Y)$_3^{2+}$ (Z$^-$)$_2$, wherein X may be Ir or Ru, Y may be 2,2'-bipyridine, and Z$^-$ may be a molecular anion such as ClO$_4^-$ or PF$_6^-$, or combination thereof.

One or both of the first and second electrodes may be transparent or semitransparent.

The conducting and transparent electrodes may comprise a transparent oxide, such as indium-tin oxide, or a thin film of a transparent conductor such as Au, Ag, Pt, Al, carbon nanotubes, graphene, poly(3,4-etylenedioxythiophene)-poly(styrene sulfonate) (PEDOT:PSS), or Ag-nanowires.

One or both of electrodes may comprise a metal such as Al, Ag or Au.

One or both of the first and second electrodes may be coated with one or more layers of a material or materials selected from a group comprising poly(3,4-etylenedioxythiophene)-poly(styrene sulfonate) (PEDOT:PSS), ZnO and graphene.

The coated layer separates the active material from the electrode in order to suppress undesired electrochemical side reactions at the electrode surface. The coated layer allows for electron or hole transport between the electrode and the active layer. The thickness of the layer could be 1-100 nm, or 1-1000 nm. The layer should preferably allow for at least 80% transmission at the emitted wavelength.

The first constituent of the light-emitting electrochemical cell may consist of one or two host compounds.

The second constituent of the light-emitting electrochemical cell may consist of one guest compound.

According to a second aspect there is provided a method for producing a light-emitting electrochemical cell comprising providing a substrate, providing a first electrode on the substrate, providing at least one light-emitting active material layer on the first electrode, and providing a second electrode on the active material layer. The light-emitting active material layer comprises a combination of an electrolyte, a first constituent and a second constituent, wherein a quotient between a difference in LUMO energy level between the first and second constituent, $E_{trap}^n$, and a difference in HOMO energy level between the second and first constituent, $E_{trap}^p$, is $\frac{1}{10}$ to 10, a quotient between electron mobility and hole mobility on the first constituent is $\frac{1}{100}$ to 100, a quotient between the number of ions of the electrolyte and the number of molecules or repeat units of the second constituent is $\frac{1}{3}$ to 5 and a LUMO energy level of the electrolyte is higher than the LUMO energy level of the first constituent and a HOMO energy level of the electrolyte is below the HOMO energy level of the first constituent.

The light-emitting active material layer may be provided in direct contact or indirect contact, i.e. via another layer, with the first and second electrodes.

The light-emitting active material layer may be provided on the first electrode by means of solution processing under an ambient air pressure of at least about 1 kPa.

The ambient air pressure may be at least about 5 kPa, at least about 10 kPa, at least about 50 kPa, at least about 100 kPa or at least about 101 kPa, and below about 1100 kPa, below about 500 kPa, below about 250 kPa, below about 150 kPa or below 105 kPa.

The light-emitting active material layer may be provided on the first electrode by means of spray-coating.

The spray-coating may be performed as described for example in U.S. Pat. No. 9,515,282 B2.

The method may further comprise a step of providing one or more layers between an electrode and the light-emitting active material layer in the light-emitting electrochemical cell, wherein the material or materials of the at least one layer may be selected from a group comprising poly(3,4-etylenedioxythiophene)-poly(styrene sulfonate).

The method may further comprise a step of encapsulating the light-emitting electrochemical cell in such a way that oxygen and water penetration into the active material layer may be reduced.

The light-emitting electrochemical cell may be encapsulated using barrier materials and adhesives, such as glass and epoxy.

The method may further comprise a step of introducing an outcoupling film or structure to increase light output from the light-emitting electrochemical cell.

Outcoupling of LEC devices is known in the art to increase the light output from a LEC. The outcoupling film or structure may comprise e.g. microlenses.

According to a third object there is provided a method of operating the light-emitting electrochemical cell described above by providing a voltage over the electrodes of the light-emitting electrochemical cell.

The voltage may be supplied at a value sufficient to achieve a current density of 0.1 to 5000 $A/m^2$, preferably 1 to 500 $A/m^2$, 5 to 200 $A/m^2$, 20 to 80 $A/m^2$, or 50 to 100 $A/m^2$.

The area is here the effective area of the light-emitting electrochemical cell, e.g. the area of overlap of the two electrodes in which area of overlap there is presence of light-emitting active material.

The current density is a measure independent of the effective area of a light-emitting electrochemical cell.

When operating the light-emitting electrochemical cell as described above an external quantum efficiency of the light-emitting electrochemical cell as such, i.e. for a light-emitting electrochemical cell void of an outcoupling film or structure, may be larger than 2%, preferably larger than 3%, 4%, 5%, 6%, 7%, 8%, 9%, 10% or larger than 11%.

When operating the light-emitting electrochemical cell as described above more than 50%, preferably more than 60%, more than 70%, more than 80%, more than 90%, more than 95%, or more than 99% of photons emitted from the light-emitting electrochemical cell may be emitted from the second constituent.

BRIEF DESCRIPTION OF THE DRAWINGS

FIGS. 2a-2d show the CV traces recorded on thin films of different host and guest compounds, as specified in the insets.

FIG. 2e shows the CV traces recorded for $THABF_4$ as electrolyte (solid line) and a TMPE-OH:$LiCF_3SO_3$ as electrolyte (dashed line).

FIG. 4b shows the CV trace in the cathodic regime for an OXD-7 film using $THABF_4$ as electrolyte. (The scale of the y-axis ranging from $-6 \times 10^{-5}$ to 0 A.)

FIG. 4c shows the CV trace in the cathodic regime for an OXD-7 film using TMPE-OH:$LiCF_3SO_4$ as electrolyte. (The scale of the y-axis ranging from $-2 \times 10^{-3}$ to 0 A.)

FIG. 4d shows the CV trace in the anodic regime for a PVK film using $THABF_4$ as electrolyte. (The scale of the y-axis ranging from $-1 \times 10^{-3}$ to $3 \times 10^{-3}$ A.)

FIG. 4e shows the CV trace in the anodic regime for a PVK film using TMPE-OH:$LiCF_3SO_4$ as electrolyte. (The scale of the y-axis ranging from $-5 \times 10^{-4}$ to $1 \times 10^{-3}$ A.)

FIG. 7 shows a table summarizing the performance of selected host-guest LECs.

THEORY

To increase the efficiency of a LEC device at high luminance, tailored traps may be introduced in the light-emitting active material layer sandwiched between and contacting the two electrodes of the LEC, blocking exciton diffusion that precedes quenching in conventional LECs. To circumvent the undesired side effect of a reduced mobility of the mobile charges in the p- and n-doped regions due to the very same traps, the trap and ion concentrations may be balanced in such a way that in the p- and n-type regions the traps are filled by the ion-induced doping, leading to a nearly trap-free transport.

Figure 1A:
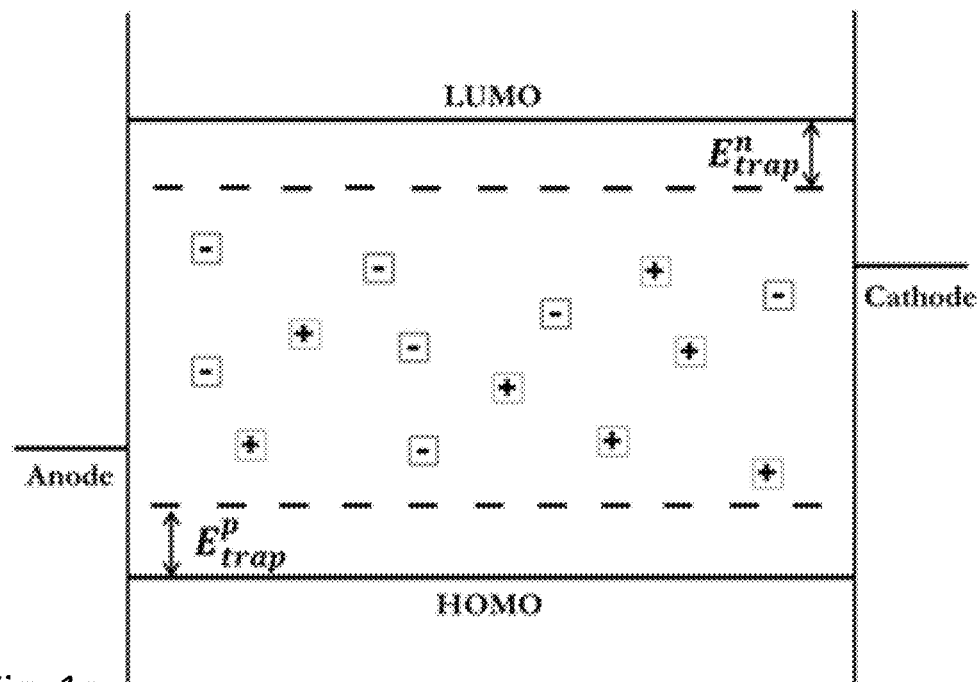
FIG. 1a shows a schematic of a theoretical target host-guest LEC at open circuit.

FIG. 1*a* shows a schematic of a target host-guest LEC active material, with the guest energy levels (dashed lines) symmetrically positioned within the energy gap of the host (solid lines).

Figure 1B:
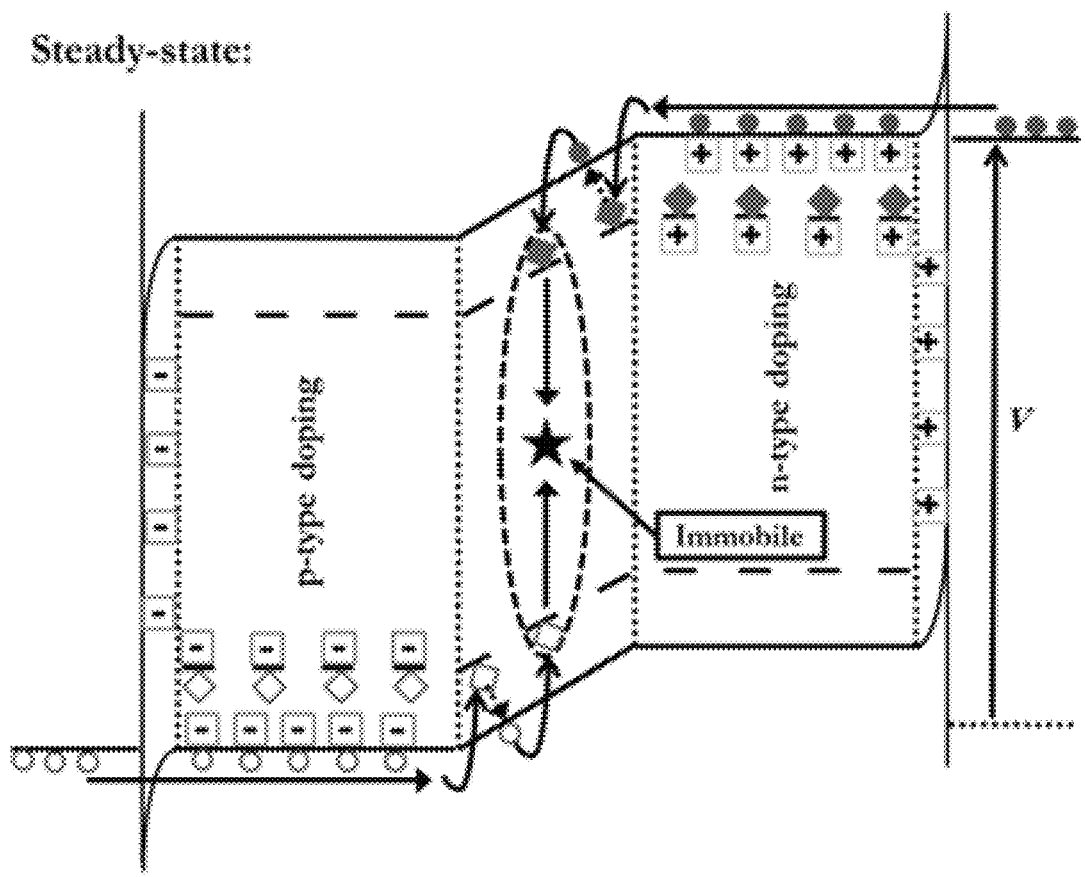
FIG. 1b shows a schematic of a theoretical target host-guest LEC during steady-state operation.

FIG. 1*b* displays its steady-state operation when the electrolyte ions have assisted with the doping (filling) of essentially all of the guest "traps", as well as some of the host sites, in distinct doping regions next to the electrodes to facilitate for a large current. The central p-n junction is left doping-free to allow for efficient emission from immobile triplet excitons localized on guest traps. (Symbols used in FIGS. 1*a* and 1*b* are identified in the panel in FIG. 1*c*.)

To investigate whether the target LEC operation is attainable, and, if so, to establish rational device design guidelines, numerical simulations were performed on a variety of different host-guest LEC architectures.

Simulations

Figure 1C:
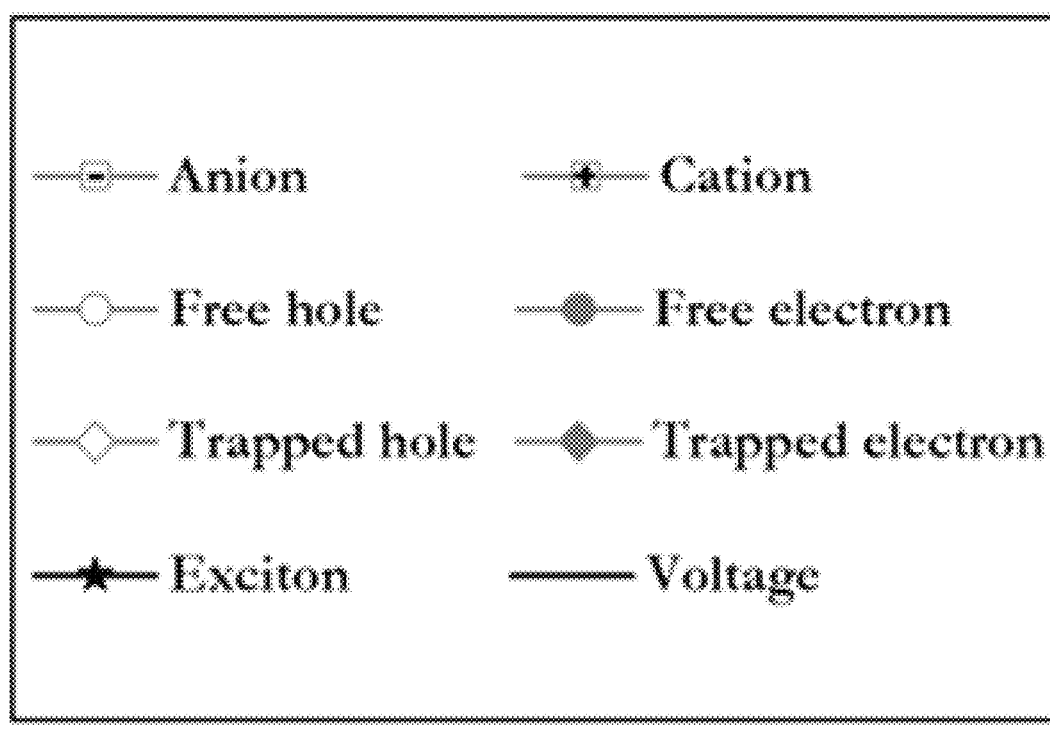
FIG. 1c shows symbols used in FIGS. 1a and 1b (and FIGS. 1d-1f and FIGS. 9c-d).
Figure 1D:
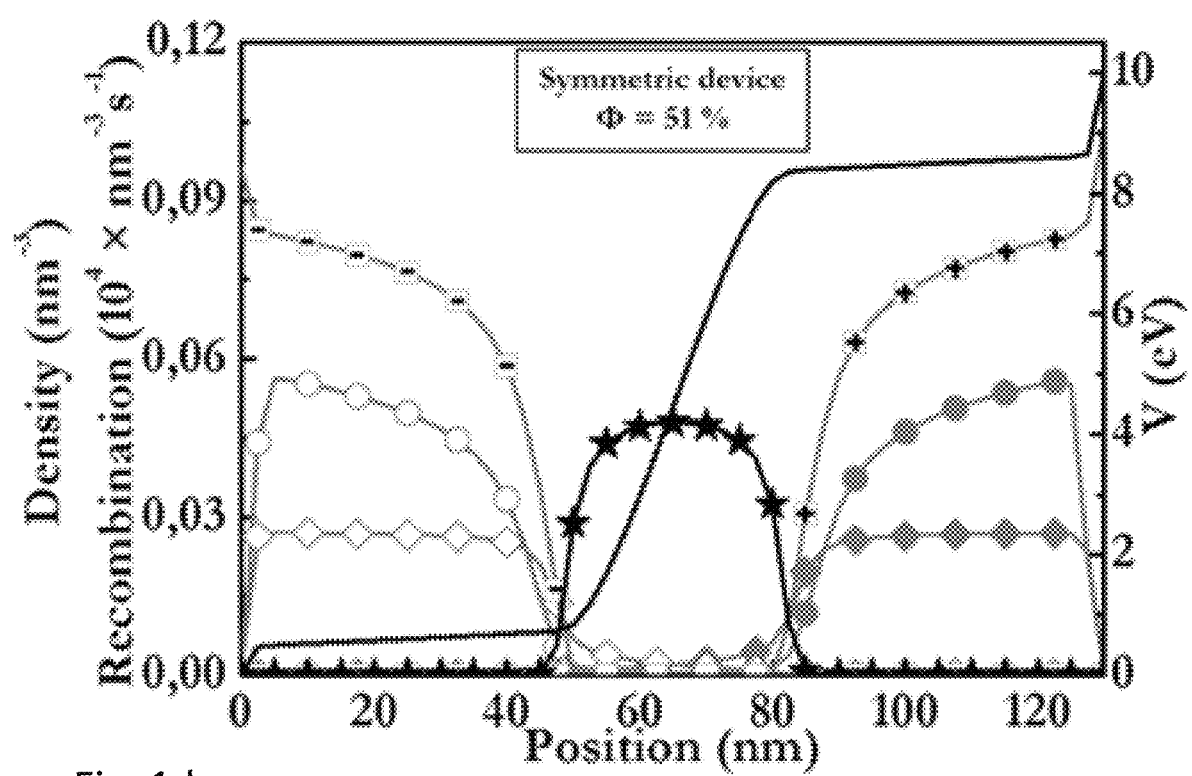
FIG. 1d shows a simulated steady-state concentration and voltage profiles for a symmetric host-guest LEC. The left y-axis represents the density ($nm^{-3}$) of relevant charge carriers (anions, cations, free electrons, free holes, trapped electrons, and trapped holes) and the recombination rate ($10^4 \times nm^{-3} s^{-1}$) of electrons and holes into excitons.

The simulated steady-state concentration and voltage profiles for the best performing LEC device having a symmetric host-guest active material is shown in FIG. 1*d* (symbols identified in FIG. 1*c*). All ions have here performed electrochemical doping, as evidenced by that the ion concentration (squares) is equal to the sum of the free polarons on the host (circles) and the trapped polarons on the guest (diamonds) throughout the active material. The only exception is next to the electrode interfaces, where electric-double layers have formed to compensate for the significant energy difference (1 eV) between the Fermi level of the injecting electrode and the accepting energy level of the primary transport material, i.e. the host—this characteristic feature of LECs that allows the use of air-stable electrodes is not affected by the introduction of traps.

The coupled ion/polaron concentration profile defines a distinct doping structure for a 130-nm thick device, with 45-nm-thick p-type doping and n-type doping regions bridging the p-n junction, where the total polaron concentration remains very low. It was found that essentially all guest traps ($c_{trap}$=0.03 nm$^{-3}$) were filled in the doping regions, while the emission was observed to originate solely from immobile excitons (stars) positioned on dispersed guest molecules in the p-n junction. The device thus accomplished the targeted doping and emission profiles, as schematically indicated in FIG. 1(*b*), and the in silico functionality of the concept was evidenced by the high simulated electron-to-photon quantum efficiency of Φ=51% (assuming 100% photoluminescence quantum efficiency of the guest emitter and perfect outcoupling) at a large current density of j=4.5 mA/cm².

Figure 1E:
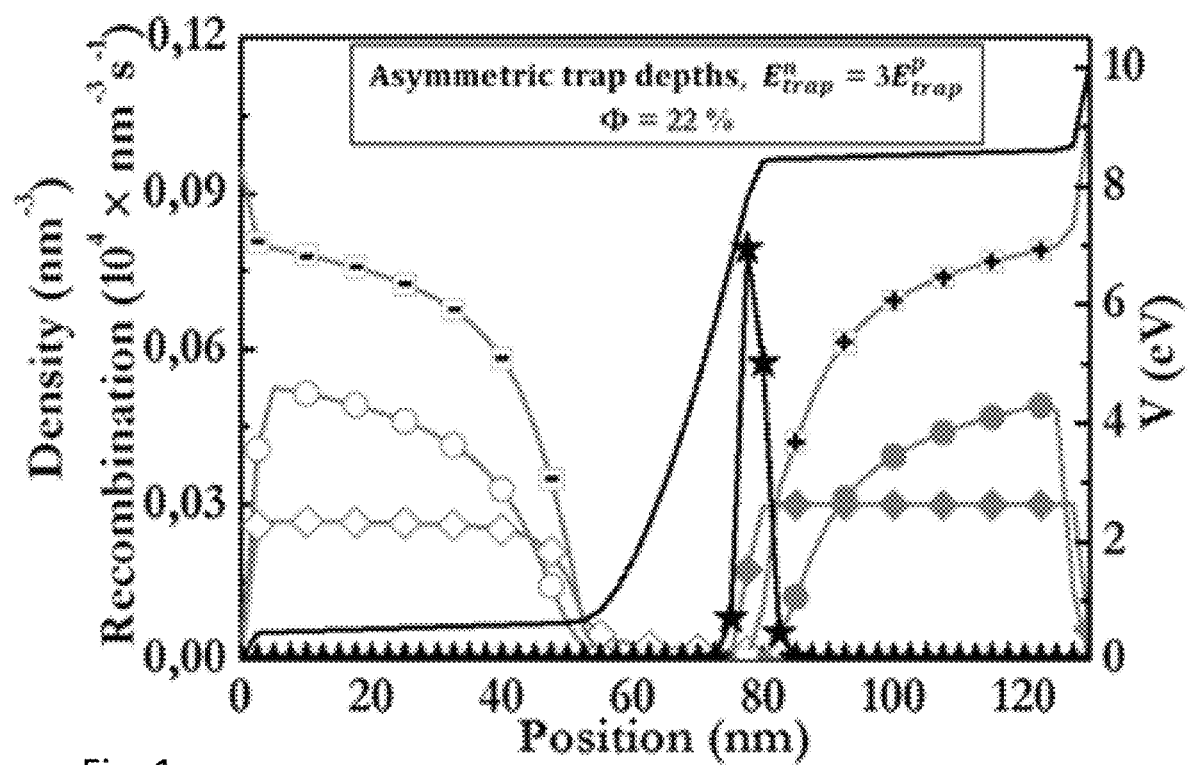
FIG. 1e shows a similar device as FIG. 1d but with a deepened electron-trap level. The left y-axis represents the density ($nm^{-3}$) of relevant charge carriers (anions, cations, free electrons, free holes, trapped electrons, and trapped holes) and the recombination rate ($10^4 \times nm^{-3} s^{-1}$) of electrons and holes into excitons.
Figure 1F:
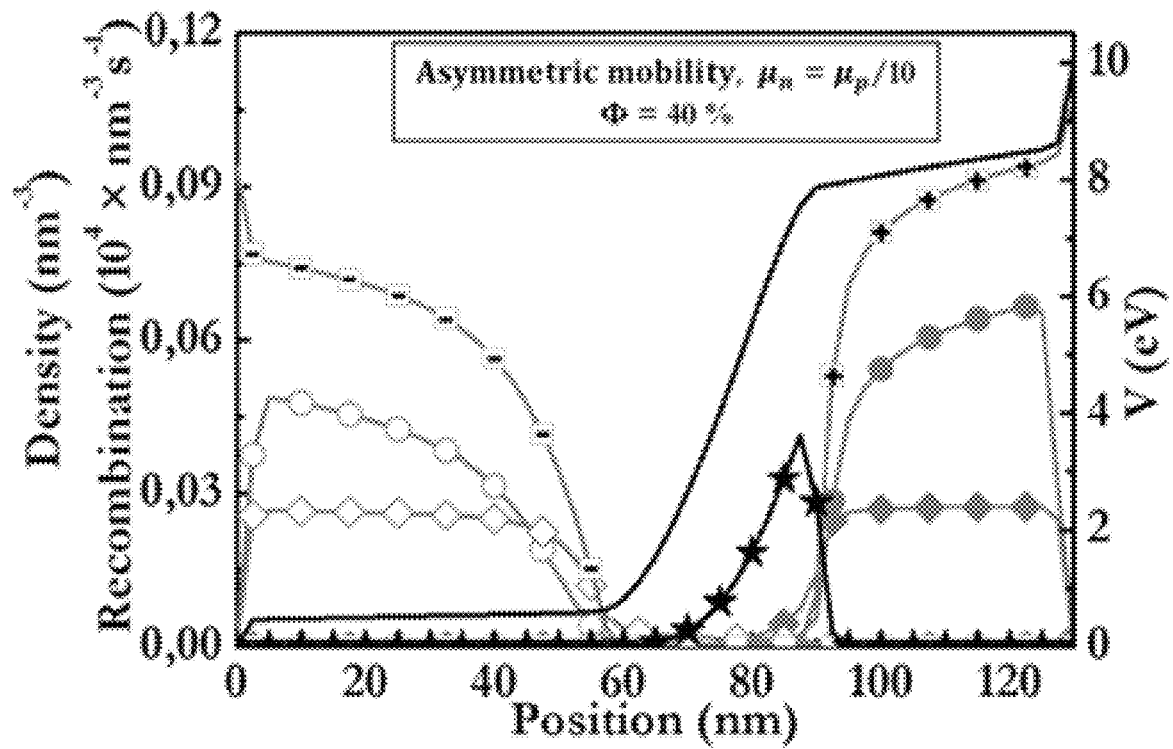
FIG. 1f shows a similar device as FIG. 1d but with a decreased electron mobility in the host. The left y-axis represents the density ($nm^{-3}$) of relevant charge carriers (anions, cations, free electrons, free holes, trapped electrons, and trapped holes) and the recombination rate ($10^4 \times nm^{-3} s^{-1}$) of electrons and holes into excitons.

A second outcome of the extensive simulation study was that the performance of the host-guest LEC active material was highly sensitive to the selection and symmetry of a number of controllable device parameters. FIGS. 1*e* and 1*f* present the concentration and voltage profiles for devices with asymmetric hole and electron trap depths and asymmetric hole and electron mobilities in the host, respectively, as specified in the insets. When the electron-trap depth is increased (FIG. 1*e*), or the electron mobility is lowered (FIG. 1*f*), the exciton profile is strongly shifted towards the n-type doping region, with the consequence being a notably increased overlap between the electron-polaron and exciton populations. The concomitant increase in exciton-polaron quenching is manifested in that the efficiency dropped to Φ=22% (at j=2.8 mA/cm²) for the asymmetric trap-depth device and to Φ=40% (at j=1.8 mA/cm²) for the asymmetric mobility device.

For the numerical simulations, a 2D drift-diffusion model was used as described in van Reenen et. al., *Fundamental Tradeoff between Emission Intensity and Efficiency in Light-Emitting Electrochemical Cells.* Adv. Funct. Mater. 2015, 25, 3066-3073. In brief, the model solves the coupled continuity equations for electronic and ionic charges and Poison's equation on a 2D grid by forward integration in time until steady-state has been reached. Motion of all charged species is described by the drift-diffusion equation assuming that the Einstein relation holds. Trap levels are implemented as discrete energy levels whose steady-state occupation is determined by Fermi-Dirac statistics. In the absence of traps, electron-hole recombination is described as a Langevin process; with traps present, recombination is described as a Shockley-Read-Hall process. In both cases, the recombination rate constant is $R=q\mu_R/\varepsilon_0\varepsilon_r$ where the recombination mobility $\mu_R$ equals the (sum of the) mobility (mobilities) of the mobile carrier(s). In the absence of traps, excitons can diffuse and exciton-polaron quenching is in that case described by a rate constant as:

$$k_1(t) = 4\pi N R_{eff} D \left[1 + \frac{R_{eff}}{(\pi D_{ex} t)^{1/2}}\right]$$

where N is Avogadro's number divided by 1000, $D_{ex}$ the exciton diffusion constant and $$R_{eff} = 0.676\left(\frac{R_0^6}{\tau_D^0 D}\right)^{1/4}$$

with $R_0$ the Förster critical radius and $\tau_D^0$ the excited state lifetime of the donor in the absence of transfer. The competing (desired) process of radiative emission occurs with a rate $k_{rad}=1/\tau_D^0$. In the presence of traps, exciton diffusion is zero and the ratio of the radiative quantum yields in the presence and absence of quenching is given by $$\frac{\Phi_D}{\Phi_D^0} = 1 - \sqrt{\pi}\,\gamma\exp(\gamma^2)[1 - \mathrm{erf}(\gamma)]$$

$$\text{where } \gamma = \frac{\sqrt{\pi}}{2} C_A \frac{4}{3}\pi R_0^3$$

and $C_A$ is the concentration of acceptors expressed in number of molecules per Å³. As in the trap-free case, the radiative emission in absence of quenching $\Phi_D^0$ is calculated as $\Phi_D^0 = n_{ex}/\tau_D^0$ with $n_{ex}$ the exciton concentration. The ratio of the radiative quantum yields was used to determine the rate of polaron quenching:

$$k_q = k_{rad}\left(\frac{\sqrt{\pi}\,\gamma\exp(\gamma^2)[1-\mathrm{erf}(\gamma)]}{1-\sqrt{\pi}\,\gamma\exp(\gamma^2)[1-\mathrm{erf}(\gamma)]}\right)$$

where $k_{rad} = 1/\tau_D^0$.

Below, the parameters used in the simulations are given. The corresponding experimental values are given in the second column when available. Typically somewhat lower concentrations for ions, traps etc. are used to reflect the fact that in the real device not all salt molecules will dissociate due to the ionic binding, nor that all guest molecules will cause a trap due to e.g. aggregation.

| Simulation | Experiment/comment |
|---|---|
| $c_{ion} = 2 \times c_{salt} = 0.06$ (nm)$^{-3}$ | 0.18 (nm)$^{-3}$ |
| $c_{trap} = 0.03$ (nm)$^{-3}$ | 0.02→0.18 (nm)$^{-3}$; 0.15 (nm)$^{-3}$ (best experiment) |
| Ion/trap ratio = 2 | 1.2 |
| $c_{host} = 0.3$ (nm)$^{-3}$ | ≈1.5 (nm)$^{-3}$ (best experiment) |
| Trap/DOS ratio = 10% | ≈10% (best experiment) |
| $E_{trap}^n = E_{trap}^p = 0.10$ eV | 0.3-0.4 eV (from CV). Simulation value set lower to reflect disorder-assisted escape of the electronic charge from its counter ion. |
| Active-material thickness = 130 nm | 130 nm |
| LUMO/HOMO = 2.7/5.6 eV | LUMO (OXD-7): 2.7 eV, HOMO (PVK): 5.6 eV |
| $E_{F,contact}$ (LEC) = 4.2/5.0 eV | Al cathode: 4.1-4.2 eV, PEDOT:PSS anode: ≈5.0 Ev |
| $E_{F,contact}$ (OLED) = 2.9/5.0 eV | Ca cathode: 2.9 eV, PEDOT:PSS anode: ≈5.0 eV |
| $\varepsilon_r = 3.6$ | |
| Free n/p mobility (host, LEC) = $1 \times 10^{-12}$ m$^2$/Vs | |
| Free n/p mobility (host, OLED) = $1 \times 10^{-10}$ m$^2$/Vs | |
| Ion mobility = $1 \times 10^{-13}$ m$^2$/Vs | Irrelevant for steady-state solution; one order slower than electronic mobility selected to be able to observe different time scales in transients |
| Exciton radiative decay rate: 1.0 μs$^{-1}$ | |
| $D_{ex} = 4.6 \times 10^{-11}$ m$^2$ s$^{-1}$ (trap-free) | Corresponds to a diffusion length of 6.8 nm |
| Förster critical radius $R_0 = 1.5$ nm | |

Identification of Appropriate LEC Materials

With the simulation results at hand, identification of appropriate LEC materials was started.

Materials

The following host materials were elected for the first evaluation: PVK, OXD-7 and PVK:OXD-7. The chemical structure of the host materials poly(9-vinycarbazole) (PVK, Sigma-Aldrich) and 1,3-bis[2-(4-tert-butylphenyl)-1,3,4-oxadiazo-5-yl]benzene (OXD-7, Lumtec) are presented in the inset of FIGS. 2a-b. Other investigated host materials include commercially available TH123 and TH105 (Merck KGaA).

A range of commercially available guest compounds were investigated, including tris[2-(5-substituent-phenyl)-pyridinato]iridium(III) (Ir(R-ppy)$_3$, Merck, see inset in FIG. 2d), tris[2-(p-tolyl)pyridine]iridium(III) (Ir(mppy)$_3$, Lumtec), and tris[2-(4-n-hexylphenyl)quinoline]iridium(III) (Hex-Ir (piq)$_3$, Lumtec); see insets in FIG. 8.

The investigated electrolytes were tetrahexylammonium tetrafluoroborate (THABF$_4$, Sigma-Aldrich, see inset in FIG. 2e) and LiCF$_3$SO$_3$ (Sigma-Aldrich) dissolved in hydroxyl-capped trimethylolpropane ethoxylate (TMPE-OH, M$_w$=450 g/mol, Sigma-Aldrich). All of the materials were used as received.

Master solutions were prepared by dissolving the constituent material in chlorobenzene at a concentration of 15 mg/ml (PVK), 30 mg/ml (OXD-7), 20 mg/ml (PVK:OXD-7), 20 mg/ml (TH123:TH105), 10 mg/ml (THABF$_4$), and 10 mg/ml (TMPE-OH:LiCF$_3$SO$_3$). The master solutions were stirred on a magnetic hot plate at 343 K for at least 5 h before further processing.

Methods

Cyclic voltammetry (CV) was carried out with an Autolab PGSTAT302 potentiostat driven by the GPES software. The working electrode comprised the material-under-study coated on an Au-covered glass substrate, a Pt rod was the counter electrode, an Ag wire was the quasi-reference electrode, and 0.1 M tetrahexylammonium tetrafluoroborate (THABF$_4$, Sigma-Aldrich) in anhydrous CH$_3$CN was the electrolyte. Directly after each CV scan, a calibration scan was run with a small amount of ferrocene/ferrocenium ion (Fc/Fc$^+$) added to the electrolyte. All CV potentials were reported vs. Fc/Fc$^+$. The reduction/oxidation onset potentials were defined as the intersection of the baseline with the tangent of the current at the half-peak-height. The energy structure (i.e., the HOMO and LUMO levels) of the material-under-study was derived using the equation $E_{VL} = -e \cdot (4.8 \text{ V} + V_{Fc/Fc+})$. The CV sample preparation and characterization were executed in a N$_2$-filled glove box ([O$_2$]<1 ppm, [H$_2$O]<0.5 ppm).

Absorption (UV-3100 spectrophotometer, Shimadzu) and photoluminescence (PL; FP-6500 spectrofluorometer, JASCO) measurements were carried out on spin-coated thin films on carefully cleaned quartz substrates.

The active-material inks were prepared by blending the host and electrolyte master solutions in a desired mass ratio, and thereafter adding an appropriate amount of the guest compound. Small-area LECs and OLEDs were fabricated by sequentially spin-coating a poly(3,4-ethylenedioxythiophene):poly(styrene sulfonate) (PEDOT:PSS, Clevios P VP Al 4083, Heraeus) ink at 4000 rpm for 60 s and the active-material ink at 2000 rpm for 60 s onto carefully cleaned indium-tin-oxide (ITO) coated glass substrates (20 Ω/square, Thin Film Devices, US). The dry thickness of the PEDOT-PSS and the active material was ≈40 nm and ≈130 nm, respectively. For the LEC (OLED), a set of four Al (Ca) cathodes was deposited on top of the active material by thermal evaporation at p<5×10$^{-4}$ Pa through a shadow mask. The light-emission area, as defined by the size of one cathode, was 8.5×1.5 mm$^2$. All of the above procedures, except for the deposition of the PEDOT:PSS layer, were carried out in two interconnected N$_2$-filled glove boxes ([O$_2$]<1 ppm, [H$_2$O]<0.5 ppm). The LEC and OLED devices were characterized using a computer-controlled source-measure unit (Agilent U2722A) and a calibrated photodiode, equipped with an eye-response filter (Hamamatsu Photonics), connected to a data acquisition card (National Instruments USB-6009) via a current-to-voltage amplifier. The EL spectra were recorded using a calibrated fiber-optic spectrometer (USB2000+, Ocean Optics).

The planar light out-coupling structure comprised hemispherical lenses in a hexagonal pattern on the surface of a 250 μm thick poly(methyl methacrylate) (PMMA) film (Microsharp). The radius and the height of each microlens were 35 and 24.5 μm, respectively. A UV-curable and single-component acrylic adhesive was used for laminating the outcoupling film onto the LEC device. The hemispherical out-coupling structure comprised a half-sphere lens (d=18 mm, Thorlabs), which was mounted onto the LEC with a specialty oil (Olympus). Both light out-coupling structures featured a refractive index of n=1.5, which matched the glass substrate onto which they were mounted. The light-emission area of the out-coupled LECs was 1.5× 1.5 mm$^2$, and was defined by etching of the ITO anode.

Large-area LECs were fabricated by spray-sintering under ambient air. The original active-material ink was diluted with 80% THF, and spray-sintered onto a pre-patterned ITO-coated glass substrate (Thin Film Devices, US) maintained at 70° C. by a hotplate. The spray-sintering deposition was executed using an in-house developed, computer-controlled spray box (LunaLEC AB, Sweden), equipped with an internal-mix spray nozzle. The $N_2$ gas pressure was set to 450×10$^3$ Pa, and the ink-feeding rate was 1 ml/min. The spray nozzle was programmed to move back-and-forth over a 10×10 cm$^2$ area in a raster-like motion, at a height of 6 cm above the substrate, and to stop after 8 completed sweeps (t=190 s). The resulting dry active-material film thickness was 350 nm. The Al top electrode was deposited by thermal evaporation through a shadow mask, defining the 67×67 mm$^2$ emission area. The luminance was measured with a luminance meter (LS-110, Konica), and the presented luminance is the average from >6 measurements on different spatial locations over the device area. The photograph was recorded by a digital camera (Canon EOS 300D) at an exposure time of 1/120 s and an aperture of f/2.2.

Materials Characterization

First, it is fundamental that the target LEC comprises host and guest compounds in the active material that can be electrochemically doped, while the electrolyte should be electrochemically inert within the voltage range spanned by the electrochemical doping reactions of the host.

In order to investigate whether the host:guest:electrolyte active material fulfills these requirements, a systematic cyclic voltammetry (CV) study was carried out.

FIGS. 2a-e present systematic cyclic voltammetry (CV) interrogations of a number of commercially available candidate compounds, with their corresponding chemical structure displayed in the inset. FIGS. 2a-2d show CV traces recorded on thin films of different host compounds (PVK, OXD-7 and PVK:OXD-7) and a guest compound (Ir(R-ppy)$_3$). In FIG. 2e a CV for the electrolytes THABF$_4$ (solid line) and TMPE-OH:LiCF$_3$SO$_3$ (dashed line) is shown.

It was found that the PVK host only features p-type doping capacity, as implied by the lack of a reversible reduction event; this conclusion is in agreement with direct optical probing of planar PVK-based LECs. The OXD-7 host and the PVK:OXD-7 blend host can, in contrast, be both electrochemically p-type and n-type doped, and are thus qualified as appropriate LEC host materials. A comparison of the top three CV traces reveals that for the blend host it is PVK that is (preferentially) p-type doped and OXD-7 that is n-type doped.

FIG. 2d shows that the Ir(R-ppy)$_3$ guest compound displays significant p- and n-type doping capacity, and that both its doping reactions are thermodynamically preferable in comparison to all three hosts.

Figure 3:
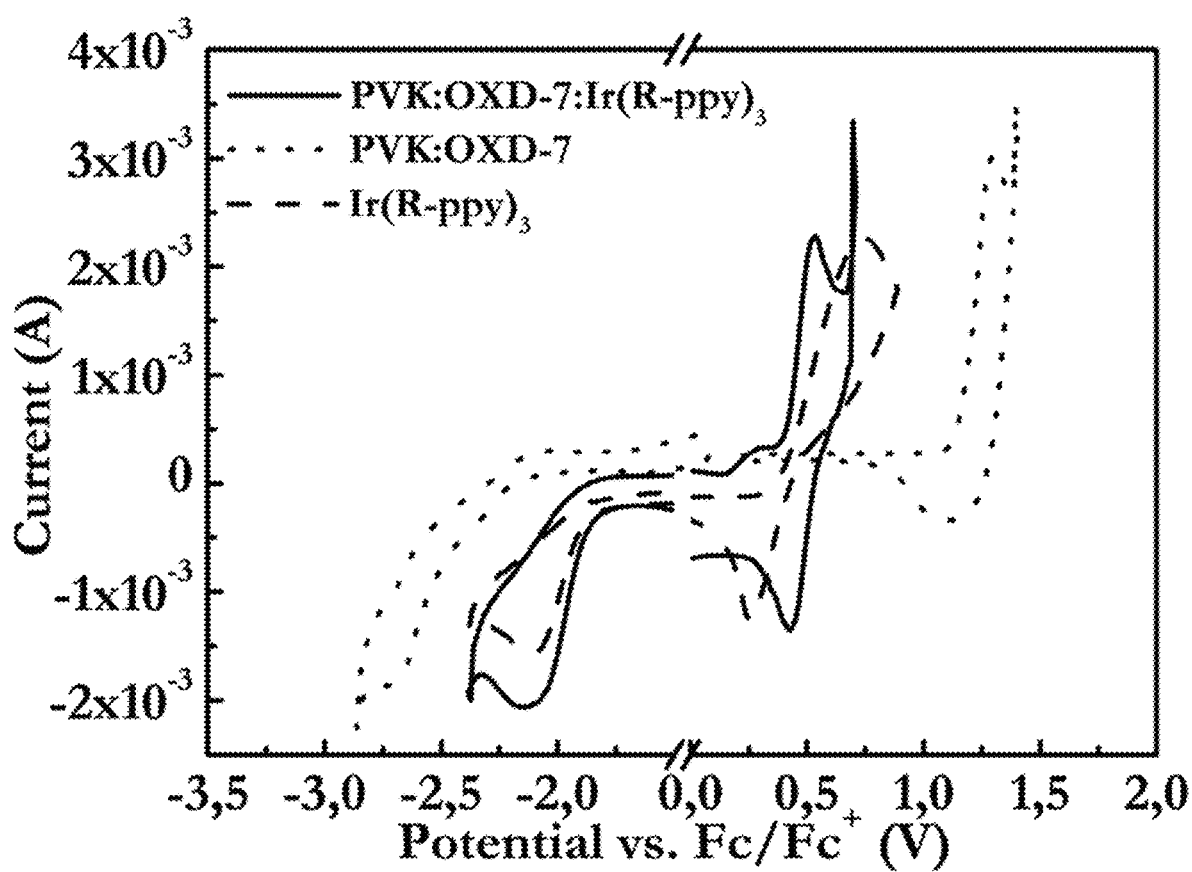
FIG. 3 shows the CV traces of a PVK-OXD-7:Ir(R-ppy)$_3$ film, PVK-OXD-7 film, and a Ir(R-ppy)$_3$ film.

FIG. 3 shows that the CV trace of a Ir(R-ppy)$_3$ thin film is similar to that of a PVK:OXD-7:Ir(R-ppy)$_3$ film, but distinctly different to that of the same film void of the Ir(R-ppy)$_3$ compound. The conclusion is thus that Ir(R-ppy)$_3$ compound can be both p- and n-type doped in the PVK: OXD-7:Ir(R-ppy)$_3$ active-material film.

FIG. 3 also reveals that it is primarily the Ir(R-ppy)$_3$ guest that is p- and n-type doped in a PVK:OXD-7:Ir(R-ppy)$_3$ blend film.

It was further found that the THABF$_4$ ionic liquid (FIG. 2e, solid line) is fit for the task of electrolyte, since it is electrochemically silent over the entire voltage range spanned by the p- and n-type doping potentials of the host and guest compounds. This is in contrast to, e.g., TMPE-OH:LiCF$_3$SO$_3$, the electrolyte of choice in recent state-of-the art CP-LECs, which electrochemical stability is insufficient (FIG. 2e, dashed line). This finding is confirmed in FIGS. 4a-e, which demonstrates that it is possible to n-type dope OXD-7 and p-type dope PVK with the THABF$_4$ electrolyte, but not with the TMPE-OH:LiCF$_3$SO$_3$ electrolyte.

Figure 4A:
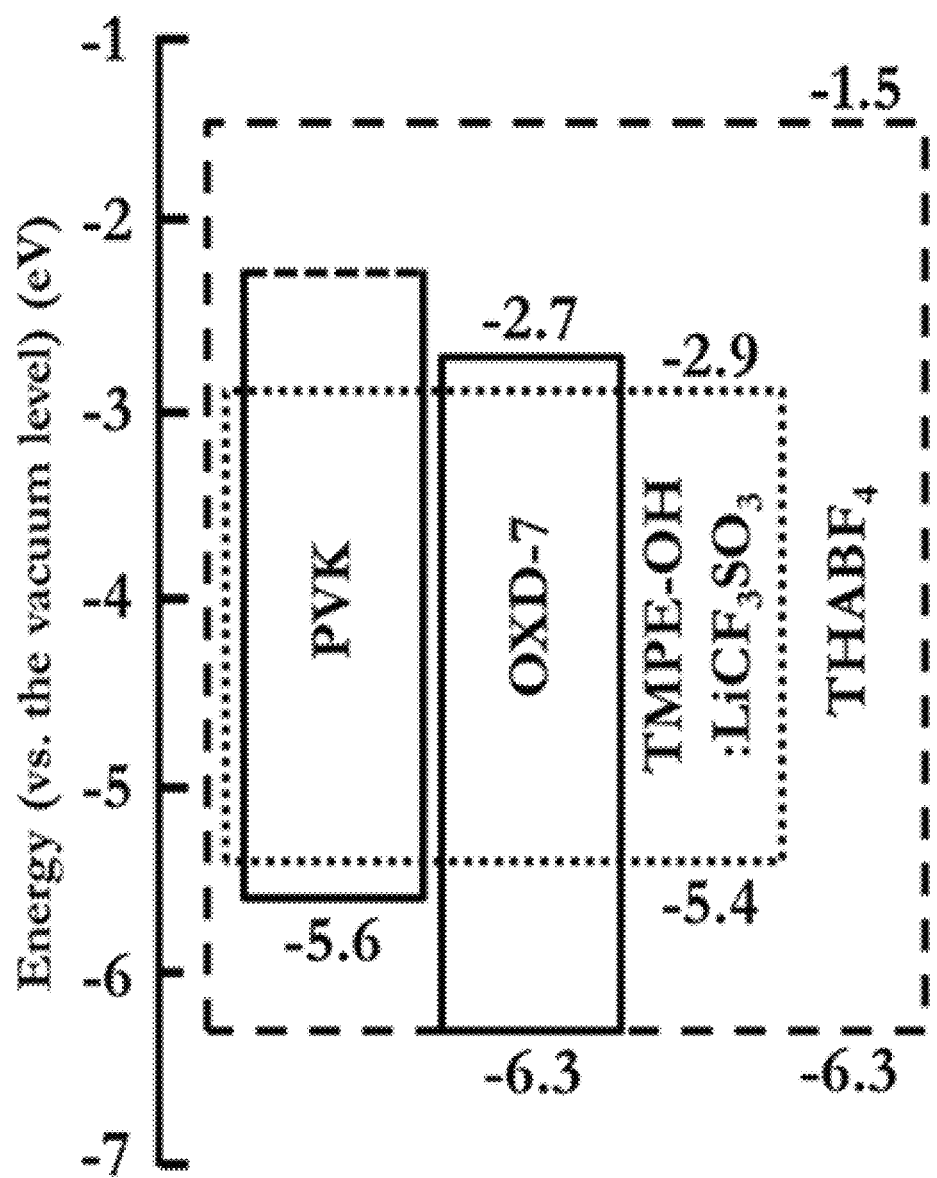
FIG. 4a shows the electron-energy levels of some of the host compounds and electrolytes.

FIG. 4a displays the electron-energy diagram for the host and electrolyte compounds. It is clear that the THABF$_4$ ionic liquid displays a broad electrochemical stability window that encompasses the p- and n-type doping potentials of the PVK and OXD-7 host compounds. In contrast, the electrochemical stability window of the TMPE-OH:LiCF$_3$SO$_3$ electrolyte is much more narrow, and not encompassing the doping potentials of the host compounds. These findings are confirmed by running CV experiments on the host compounds using either THABF$_4$ or TMPE-OH:LiCF$_3$SO$_3$ as the supporting electrolyte. With THABF$_4$ as the "doping" electrolyte, it is possible to electrochemically n-type dope OXD-7 (FIG. 4b) and p-type dope PVK (FIG. 4d), while the lower onset potential and the absence of reversibility when using TMPE-OH:LiCF$_3$SO$_3$ as the electrolyte (see FIGS. 4c and 4e) is taken as evidence for that it is the electrolyte and not the host compound that is partaking in the electrochemical reactions.

Figures 2F, 2G, 2H:
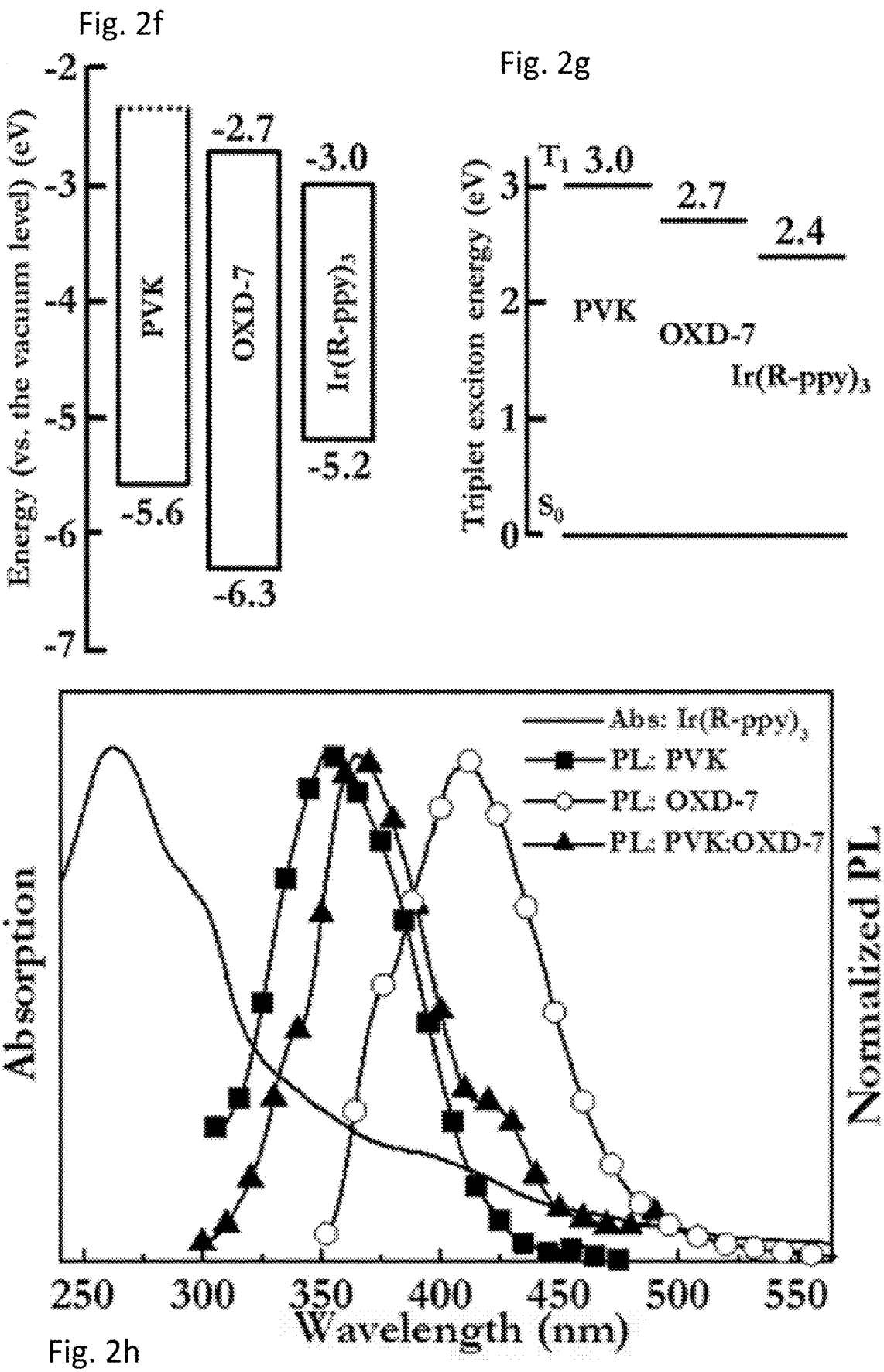
FIG. 2f shows the electron-energy levels of the host and guest materials, as extracted from the CV data.
FIG. 2g shows the triplet energies of the host and guest compounds.
FIG. 2h shows the absorption spectrum of the guest compound (solid black line) and the PL spectra of the three host materials.

FIG. 2f presents the electron-energy diagram for the host and guest compounds, as extracted from the CV data (with the exception of the LUMO of PVK that was derived from a combined absorption/CV measurement). It clearly illustrates that the exciton, as well as both the hole and electron, can be trapped on the Ir(R-ppy)$_3$ guest when positioned in any of the three host matrices, i.e. PVK, OXD-7 and the PVK:OXD-7 blend. The triplet diagram in FIG. 2g shows that host-to-guest Dexter transfer is feasible for all host systems, while the significant spectral overlap of the host photoluminescence (PL) and the guest absorption displayed in FIG. 2h implies that host-to-guest Förster resonance transfer can be efficient for all three host-guest systems. The conclusion is thus that the exciton can be efficiently funneled to the dispersed guest molecules using a combination of Förster transfer, Dexter transfer and charge trapping. After arriving at a guest molecule the exciton will not move any further, provided the guest concentration is sufficiently low to suppress exciton diffusion between different guest molecules.

Device Characterization

The characterized materials were used for the fabrication of LEC devices, comprising an indium-tin-oxide (ITO)/poly (3,4-ethylenedioxythiophene):poly(styrene sulfonate) (PEDOT:PSS) anode and an Al cathode.

FIGS. 5a-5d show temporal optoelectronic response of ITO/PEDOT:PSS/Host:Ir(R-ppy)$_3$:Electrolyte/Al LECs with the host and electrolyte selection defined in the insets with the same active-material mass stoichiometry (host: guest:electrolyte=64.6:29.0:6.4) and thickness (d=130 nm) and which were driven by the same current density, j=7.7 mA/cm$^2$. The distinguishing characteristic was the selection of the host and electrolyte, as identified in the figure insets.

Figure 6A:
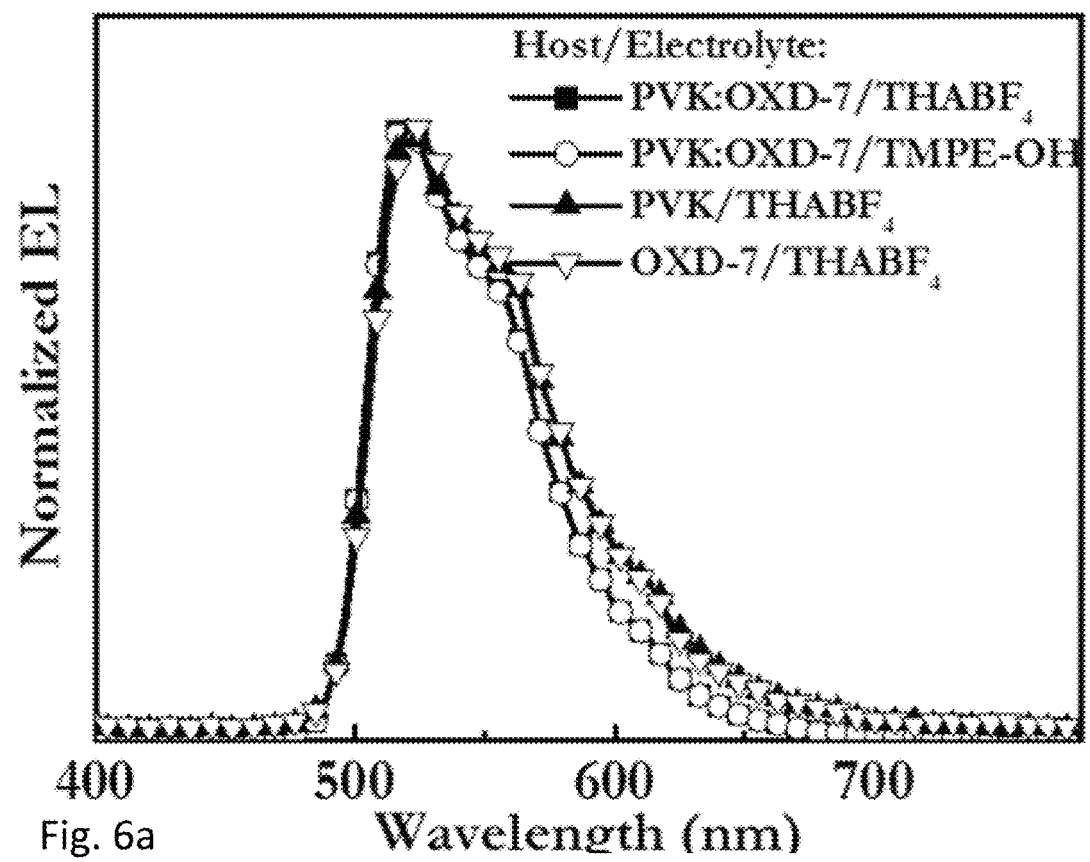
FIG. 6a shows the electroluminescence spectra of ITO/PEDOT:PSS/Host:Ir(R-ppy)$_3$:electrolyte/Al LECs, with the host and electrolyte selection identified in the inset.

FIG. 6a shows that all four devices emitted green light ($\lambda_{peak}$=520 nm) from the guest compound, indicating complete energy transfer from host to guest (see FIG. 2f-h).

Figure 5A:
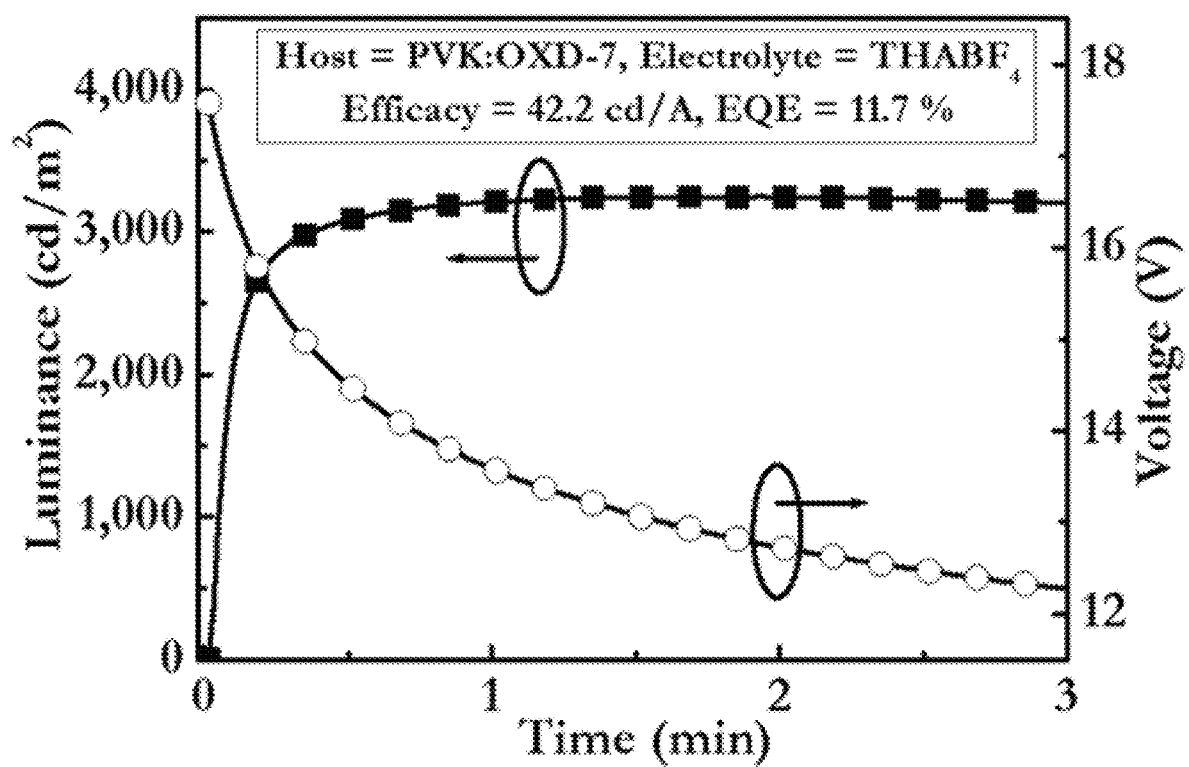
FIGS. 5a-5d show the temporal optoelectronic response of ITO/PEDOT:PSS/Host:Ir(R-ppy)$_3$:Electrolyte/Al LECs with the host and electrolyte selection defined in the insets.

The PVK:OXD-7 "blend-host" device in FIG. 5a exhibited a record-high performance for an LEC, delivering a strong luminance of 3,250 cd/m² at a current efficacy of 42.2 cd/A; the latter corresponds to an external quantum efficiency (EQE)=11.7%. (Efficiency values as presented herein are reported at maximum luminance.) The pristine blend-host device turned on fast and reached 100 cd/m² in less than 2 s and 3,000 cd/m² within 25 s, and maintained a high luminance of above 1,000 cd/m² for more than 3 h of continuous operation.

A summary of relevant device and material data is available in the table in FIG. 7.

Figure 5B:
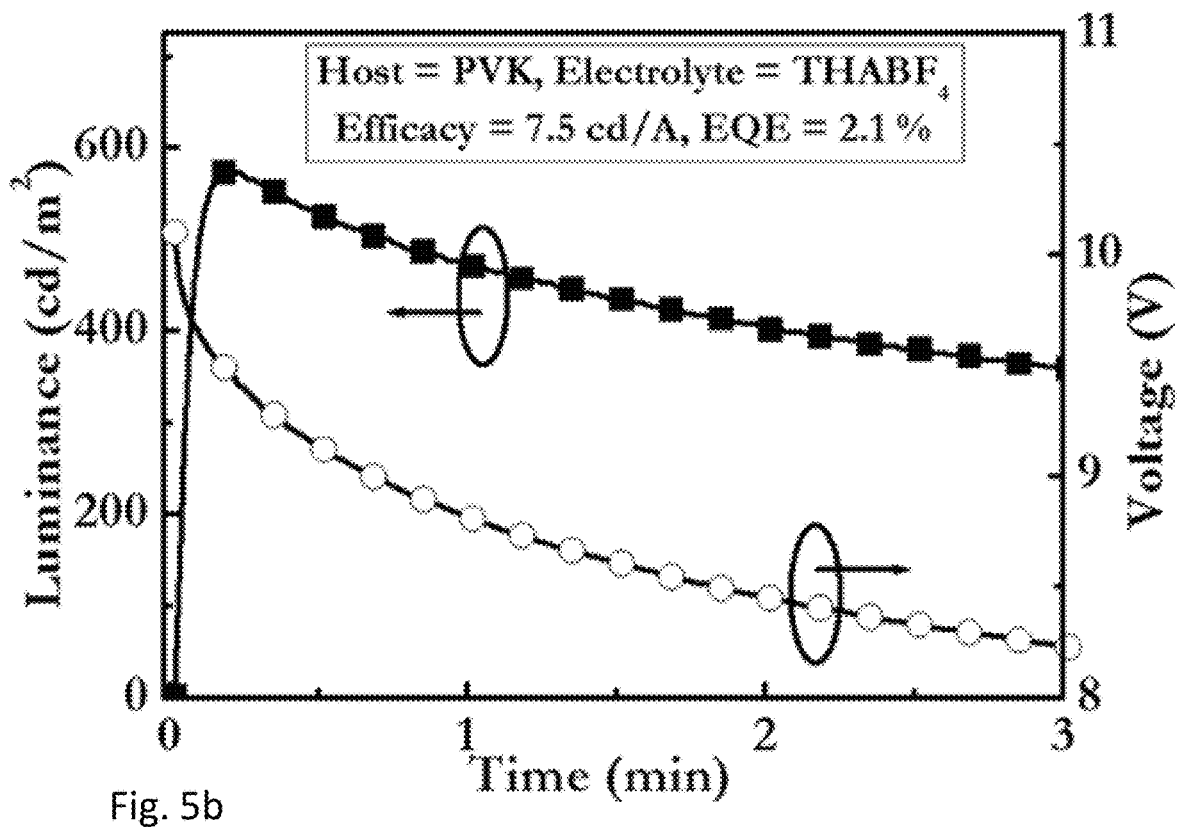

The PVK-host device in FIG. 5b delivered a peak brightness of 575 cd/m² at an efficiency of 7.5 cd/A, and the luminance began to drop already after 10 s of operation. Its comparatively poor performance may be attributed to that the PVK host only can support p-type doping (FIG. 2a), and that electrochemical side reactions accordingly will take place at the cathodic interface during device operation. The even lower performance of the blend-host device with TMPE-OH:LiCF$_3$SO$_3$ as the electrolyte instead of THABF$_4$ (FIG. 5d) is attributed to the insufficient electrochemical stability window of the electrolyte, which will effectively prohibit both p- and n-type doping of the host compounds (FIG. 2e and FIGS. 4a-e). The absence of conductivity-enhancing electrochemical doping reactions of the host compounds is further manifested in that the luminance decreases monotonically with increasing operational time.

Figure 5C:
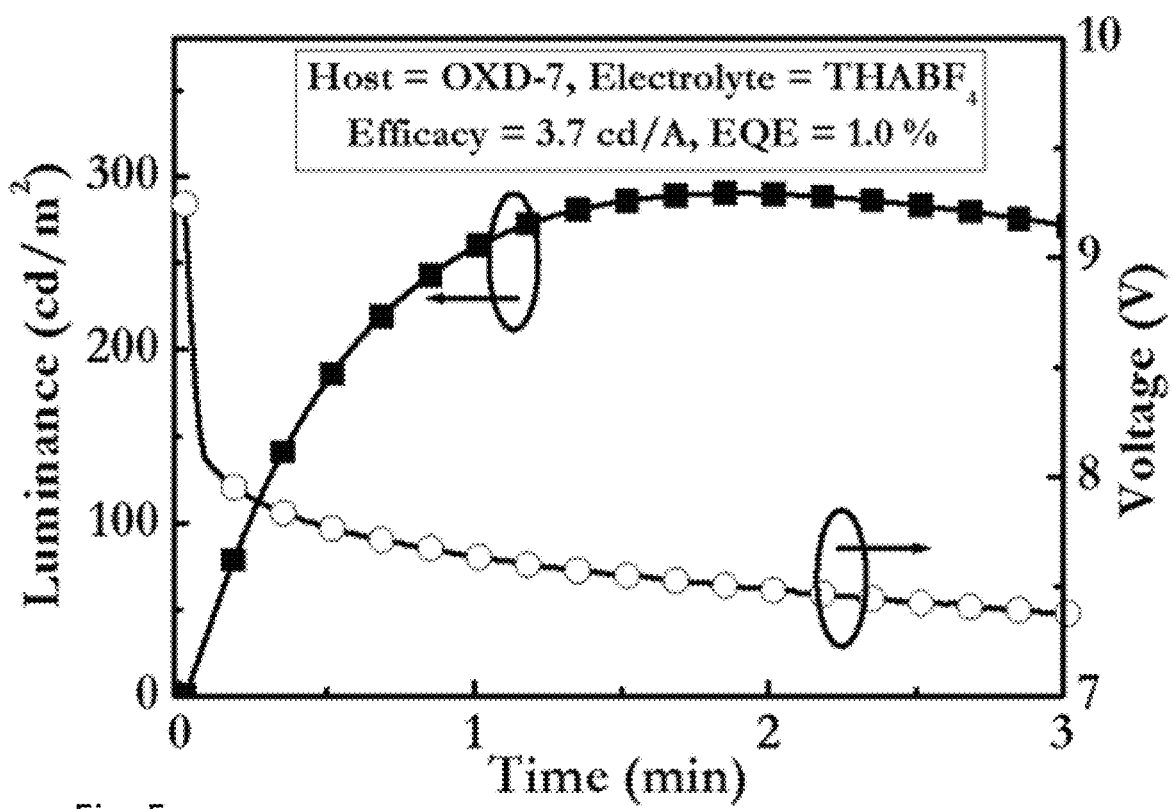
Figure 5D:
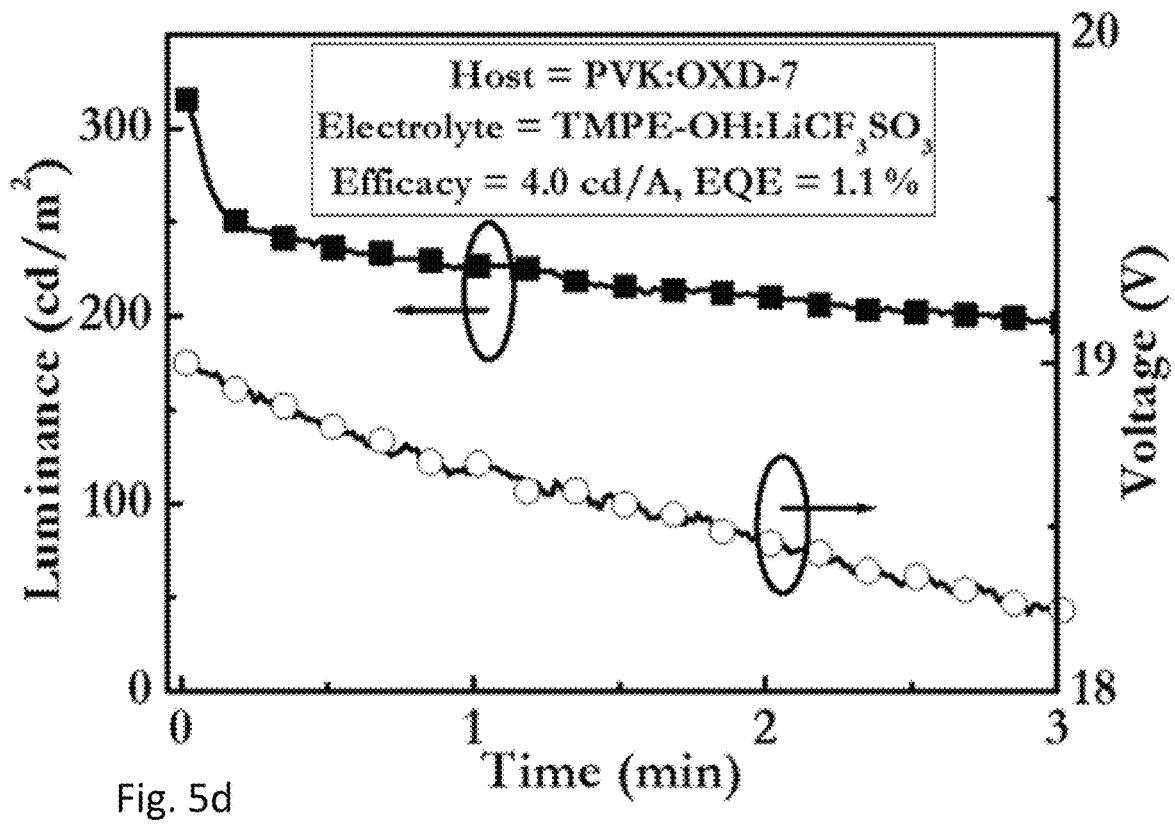

The explanation for the one order of magnitude lower efficiency for the OXD-7 device in FIG. 5c in comparison to the blend-host device in FIG. 5a is at first glance less obvious. The OXD-7 host compound can be both p- and n-type doped (FIG. 2b) and the employed THABF$_4$ electrolyte is electrochemically stable (FIG. 2e). However, with the results of the simulation study at hand (FIGS. 1c-f), the attention was directed to other material properties, in particular trap depths and charge carrier mobilities.

The nominal electron-trap depth ($E_{trap}^n$) is equal to the difference between the (lowest) LUMO level of the host(s) and the LUMO of the guest, and the nominal hole-trap depth ($E_{trap}^p$) is given by the difference between the (highest) HOMO of the host(s) and the HOMO of the guest (see FIG. 1a). Using the electron-energy diagram in FIG. 2f, it was found that for the blend-host LEC $E_{trap}^n$=0.32 eV and $E_{trap}^p$=0.38 eV; for the single-host OXD-7 LEC we obtain $E_{trap}^n$=0.32 eV and $E_{trap}^p$=1.06 eV. In other words, while the trap depths for electron and hole transport in the blend-host LEC are rather symmetric, they are notably asymmetric in the OXD-7 LEC. Moreover, the PVK:OXD-7 blend-host features a balanced electron and hole mobility, while the single-host OXD-7 material is an n-type material with a distinctly higher electron mobility. The simulation results demonstrated that an asymmetry in the trap depth (FIG. 1e), as well as an asymmetry in the electron and hole mobility (FIG. 1f), will result in an increase in detrimental exciton-polaron interactions, with a concomitant significant drop in the efficiency. Thus, the conclusion from both experiments and simulations is that it is paramount to pay attention to the symmetry of the trap-depth and mobility parameters when designing a high-performance host-guest LEC.

Figure 8A:
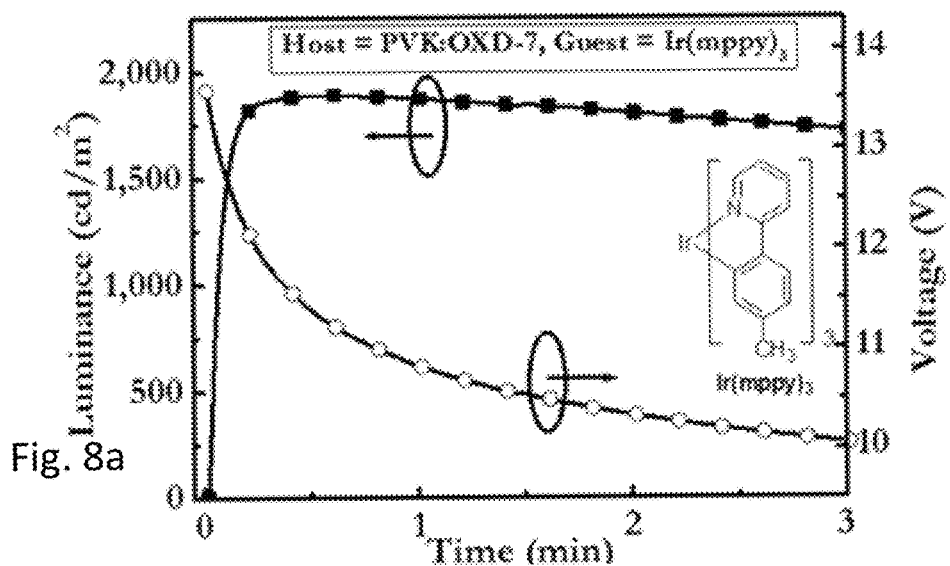
FIGS. 8a-c show the temporal optoelectronic response of ITO/PEDOT:PSS/Host:guest:$THABF_4$/Al LECs with the host and guest selection defined in the inset.
Figure 8B:
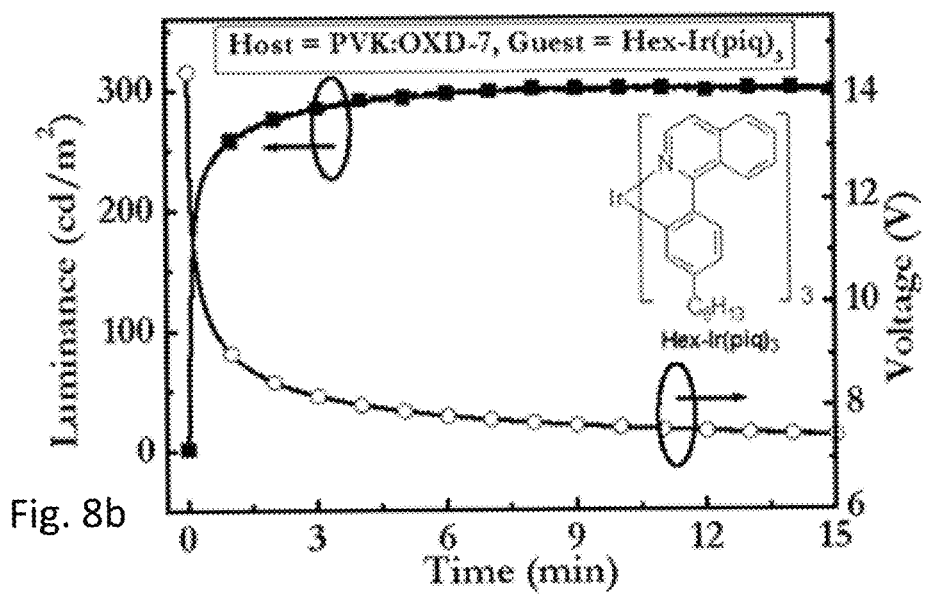
Figure 8C:
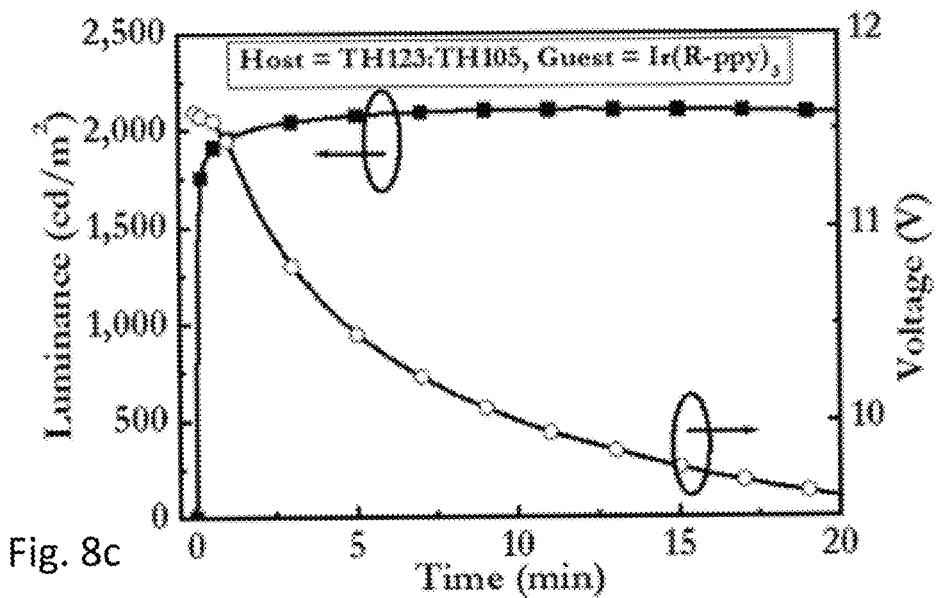

A range of different host-guest combinations have been investigated, and three additional host-guest LECs have been identified which feature high efficiency at strong luminance; see FIGS. 8a-c. With a green-emitting tris[2-(p-tolyl) pyridine]iridium (III) (Ir(mppy)$_3$) guest, and the same PVK: OXD-7 blend host and THABF$_4$ electrolyte, a current efficacy of 24.6 cd/A (EQE=6.9%) at 1,890 cd/m² was recorded, and with a red-emitting tris[2-(4-n-hexylphenyl) quinoline]iridium (III) (hex-Ir(piq)$_3$) guest an efficiency of 3.9 cd/A (EQE=4.9%) at 302 cd/m² was measured. With a different TH123:TH105 host blend, and the Ir(R-ppy)$_3$ guest, green emission with an efficiency of 27.4 cd/A (EQE=7.6%) at 2,100 cd/m² was detected. It is interesting that these three high-performing host-guest LECs also feature bipolar doping, balanced mobility, and reasonably balanced trap depths. A comparison does however reveal that the PVK:OXD-7:Ir(R-ppy)$_3$ LEC in FIG. 5a displayed the best performance (and the most symmetric trap depths), and in the following we have therefore opted to stay with this system. A summary of relevant device and material data is available in the table in FIG. 7.

Figure 9A:
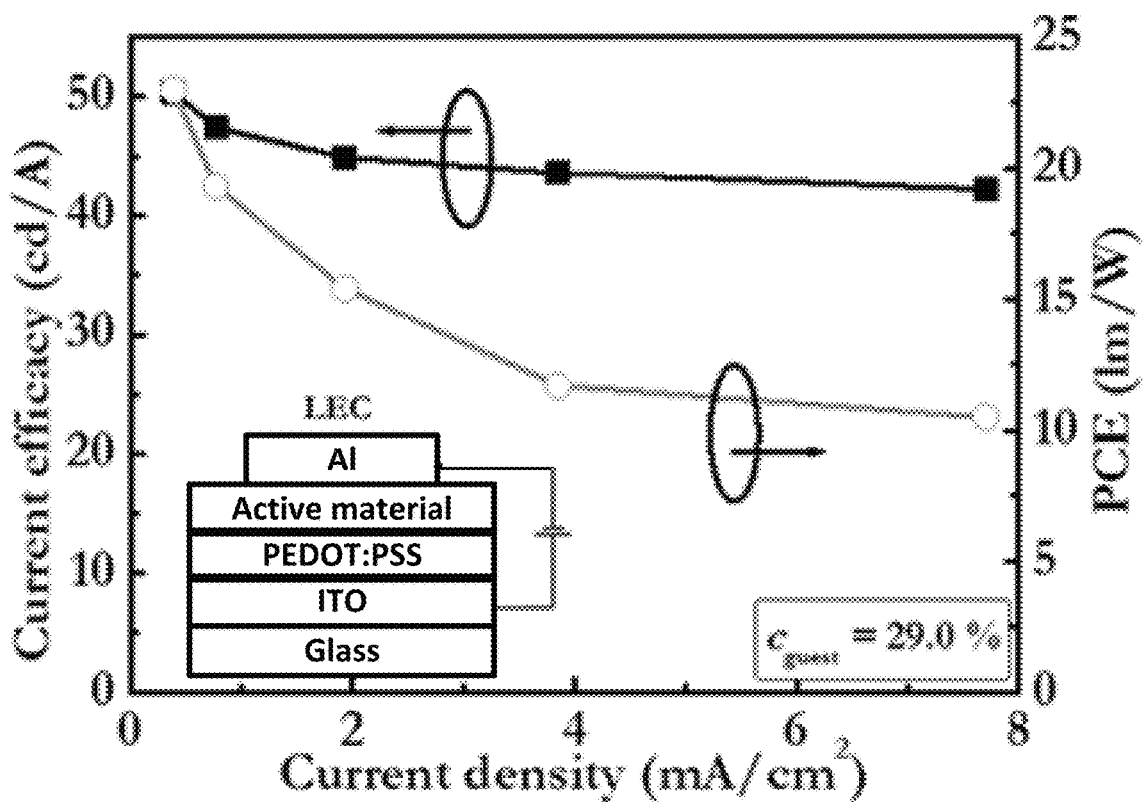
FIG. 9a shows the measured current efficacy (solid squares) and power conversion efficacy (open circles) as a function of the current density for the host-guest LEC, with a guest concentration of 29% and with the PVK:OXD-7 blend host.

A further demonstration of the suppressed exciton-polaron quenching in a well-designed host-guest LEC is provided by the efficiency-current plot in FIG. 9a. If such detrimental interactions are prominent, these will be manifested in a significant drop of the current efficacy with increasing current. Here, it was found that the current efficacy dropped marginally from 50.4 cd/A (EQE=14.0%) to 42.2 cd/A (EQE=11.7%) when the current density increased by a factor of twenty from 0.38 to 7.7 mA/cm², which implies that polaron-exciton quenching indeed is minor. Note that the highest current efficacy of 50.4 cd/A was recorded at reasonable luminance of 193 cd/m². It was further observed that the power conversion efficacy (PCE) features a stronger dependence on the drive current than the current efficacy, which is a reflection of a lowering of the drive voltage with decreasing current.

Figure 6B:
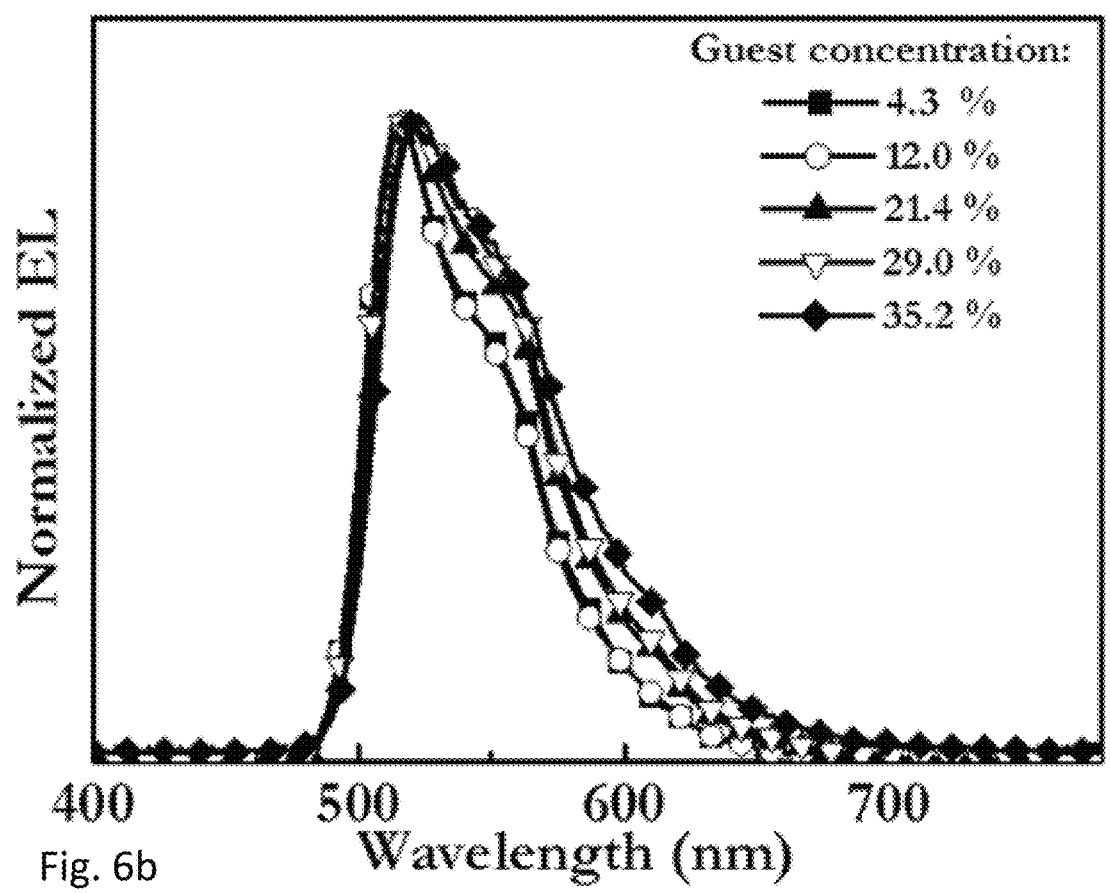
FIG. 6b shows the electroluminescence spectra of ITO/PEDOT:PSS/PVK:OXD-7:Ir(R-ppy)$_3$:$THABF_4$/Al LECs at different guest concentrations, as specified in the inset.
Figure 9B:
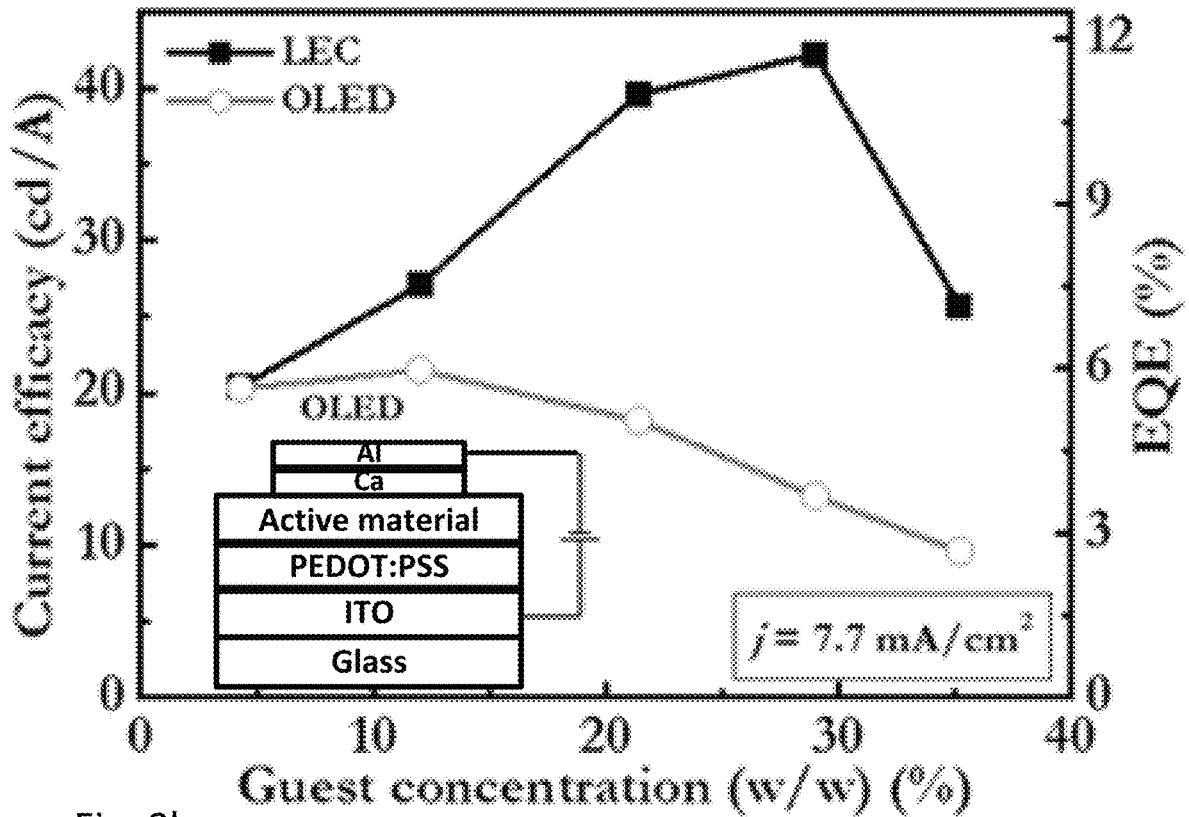
FIG. 9b shows the current efficacy (left) and the external quantum efficiency (right) as a function of guest concentration for the ITO/PEDOT:PSS/PVK:OXD-7:Ir(R-ppy)$_3$:$THABF_4$/Al LEC (solid squares) and a ITO/PEDOT:PSS/PVK:OXD-7:Ir(R-ppy)$_3$/Ca/Al OLED (open circles).

FIG. 9b presents the efficiency as a function of guest concentration for the host-guest LEC and a nominally similar OLED, void of the electrolyte and with low-work function Ca instead of Al as the cathode. The schematic LEC and OLED device structures are displayed in the insets of FIGS. 9a and 9b, respectively. Both devices display green emission from the guest compound for all concentrations (FIG. 6b), in agreement with the demonstrated efficient host-guest energy transfer. Interestingly, the LEC outperforms the OLED over the entire guest-concentration range, with the difference being largest at the higher guest concentrations. The peak efficiency of the LEC is 42.2 cd/A (11.7%), whereas the OLED peaked at 21.7 cd/A (6.0%) at a three times lower guest concentration.

Figure 9C:
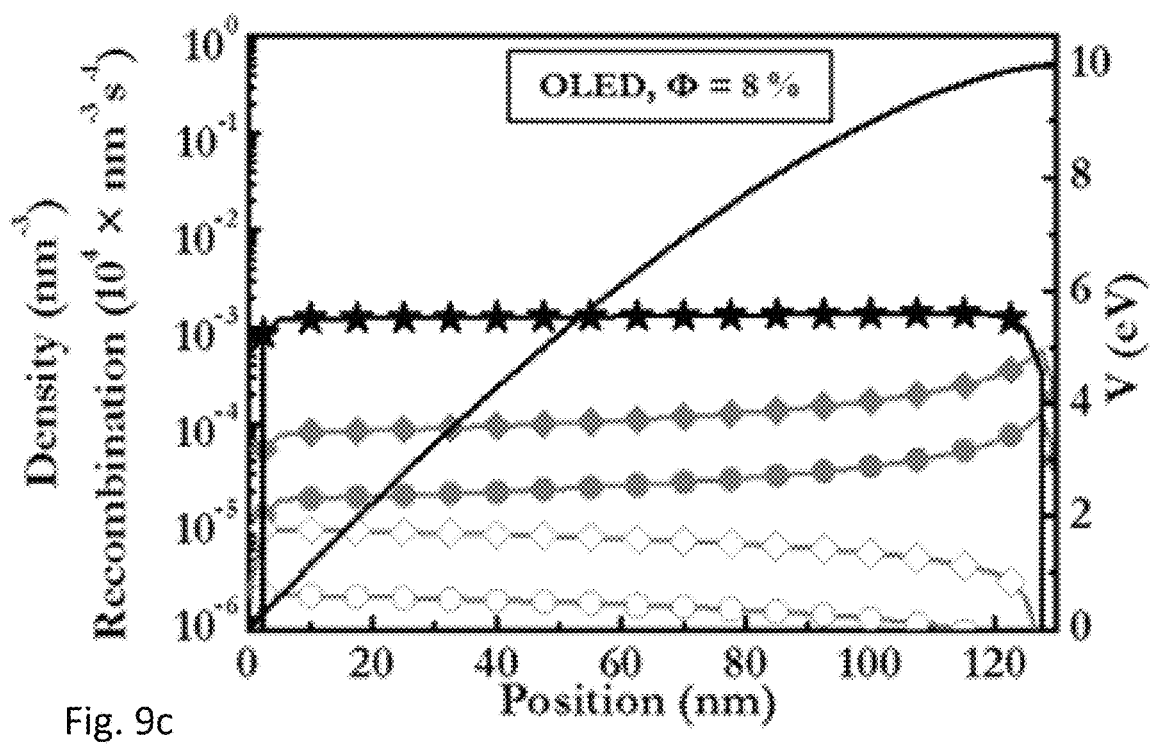
FIG. 9c shows the simulated steady-state concentration profiles for a host-guest OLED, with realistic injection barriers for electrons (0.2 eV) and holes (0.5 eV). (The left y-axis represents density ($nm^{-3}$) and recombination ($10^4 \times nm^{-3} s^{-1}$).)
Figure 9D:
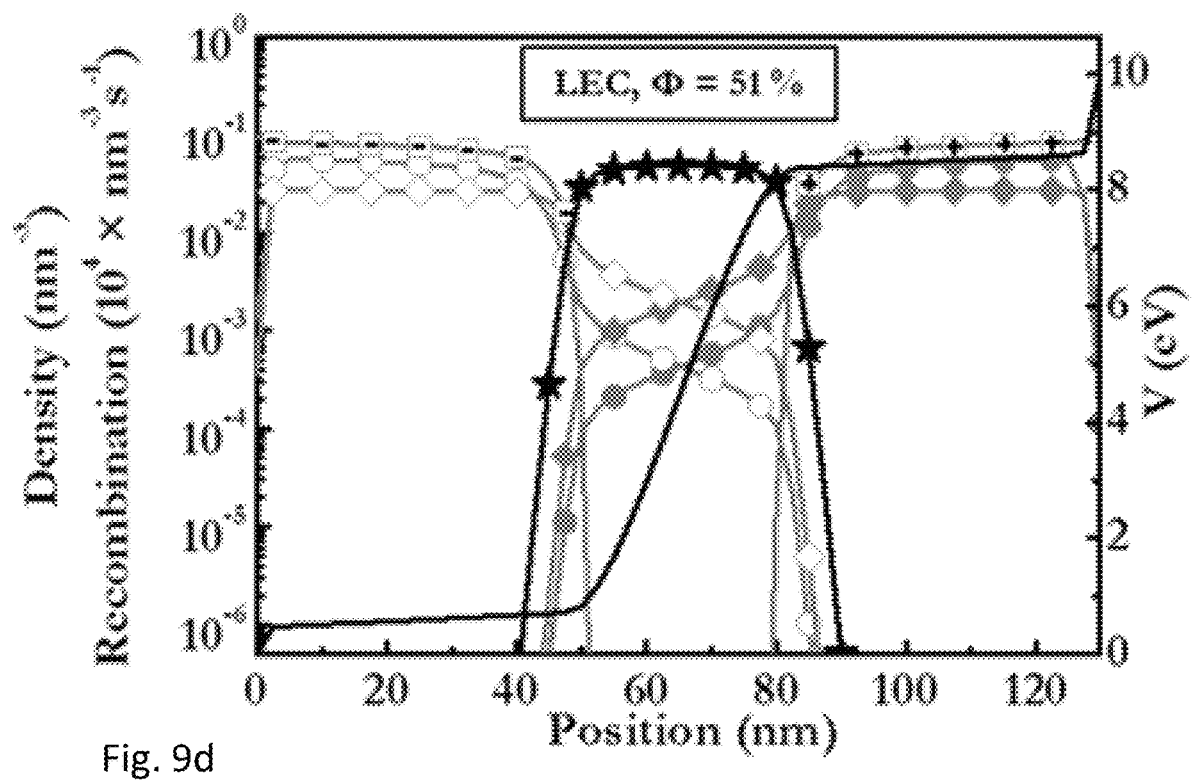
FIG. 9d shows the simulated steady-state concentration profiles for a host-guest LEC with an injection barrier of 1 eV for both electron and hole injection. (The left y-axis represents density ($nm^{-3}$) and recombination ($10^4 \times nm^{-3} s^{-1}$).)

To investigate the cause for the differences in performance, modeling results for a host-guest OLED with device-realistic injection barriers for electrons and holes of 0.2 eV and 0.5 eV, respectively, are presented (FIG. 9c), and for a host-guest LEC with a larger injection barrier of 1.0 eV for both electron and hole injection (FIG. 9d). Importantly, the opportunity for operating an LEC with large injection barriers is very attractive since it allows for the use of air-stabile electrodes and a single-layer active material. This clearly distinguishes it from the OLED, which is dependent on either an air-unstable cathode (here Ca) or a multilayer structure in order to function efficiently. Both the OLED and LEC featured symmetrical trap depths and mobilities, but in order to make the current density similar the absolute mobility was set higher for the OLED, which is reasonable in view of the absence of the electrolyte in the OLED. The absence of mobile ions in the OLED is manifested in much lower electron and hole concentrations (since there is no ion-induced screening of the electronic space charge) and a lack of electric double-layer formation at the electrode interfaces. Two more indirect consequences are that the excitons are evenly distributed, and the voltage gradient relatively constant, throughout the entire OLED active material, whereas they are well confined to the central p-n junction in the LEC device. While the simulated OLED in FIG. 9c delivers a modest electron-to-photon efficiency of $\Phi=8\%$, the LEC in FIG. 9d features a much higher $\Phi=51\%$ at approximately the same current density ($j_{OLED}=3.4$ mA/cm², $j_{LEC}=4.5$ mA/cm²).

Figure 9E:
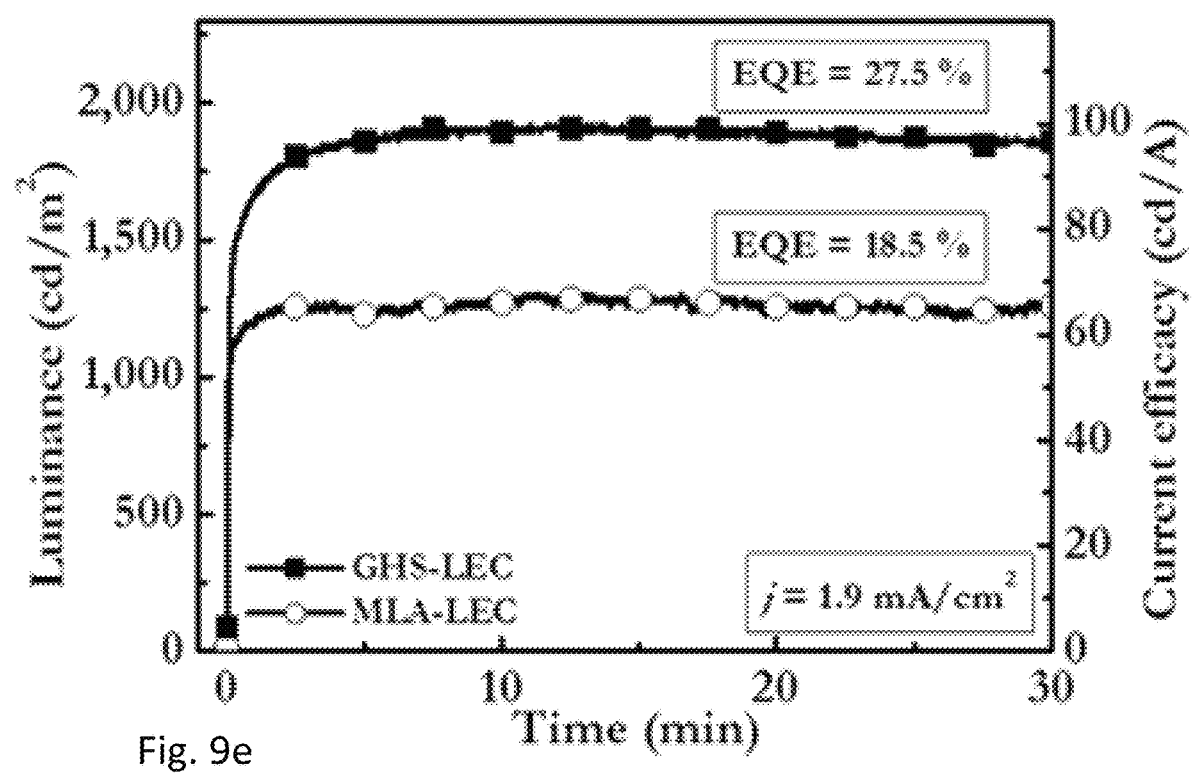
FIG. 9e shows the initial evolution of the luminance (left axis) and the current efficacy (right axis) of pristine ITO/PEDOT:PSS/PVK:OXD-7:Ir(R-ppy)$_3$:$THABF_4$/Al LECs featuring a thin film comprising a hexagonal array of hemispherical microlenses (MLA-LEC, open circles) or a glass half sphere (GHS-LEC, solid squares) as the outcoupling structure.
Figure 10A:
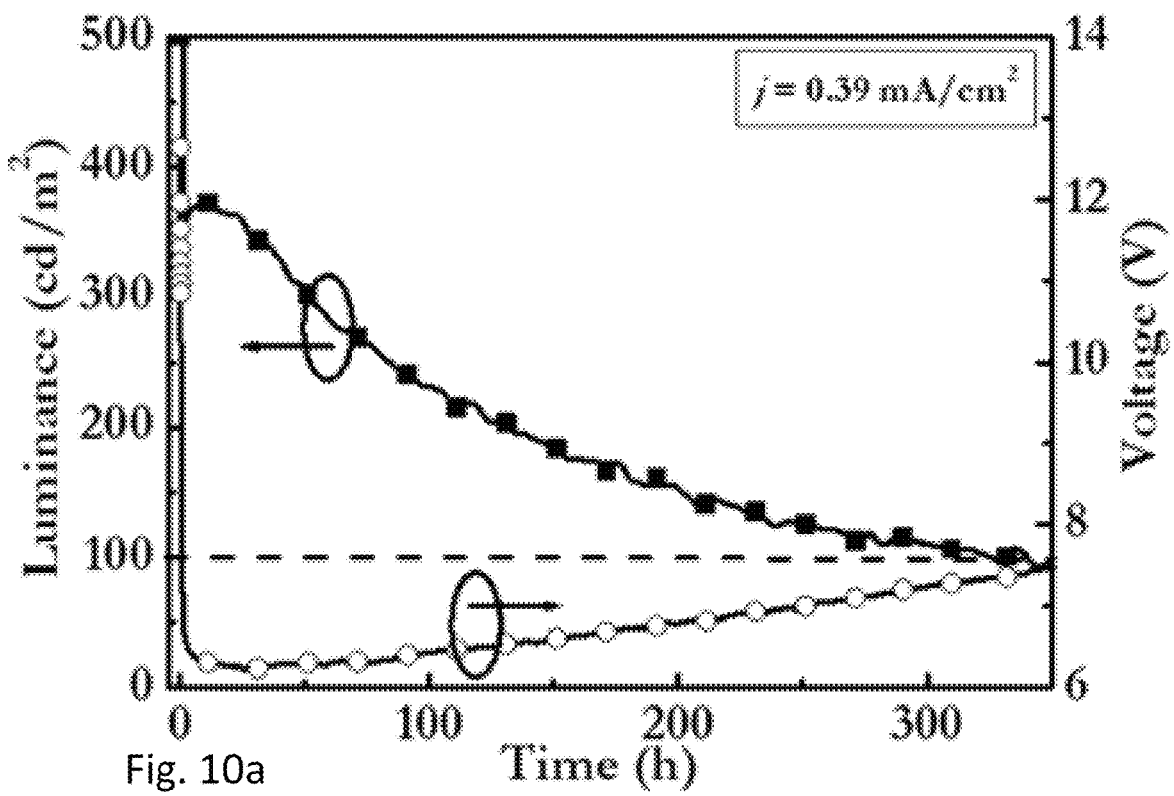
FIG. 10*a* shows the long-term operation of a GHS-LEC driven by j=0.39 mA/cm².
Figure 10B:
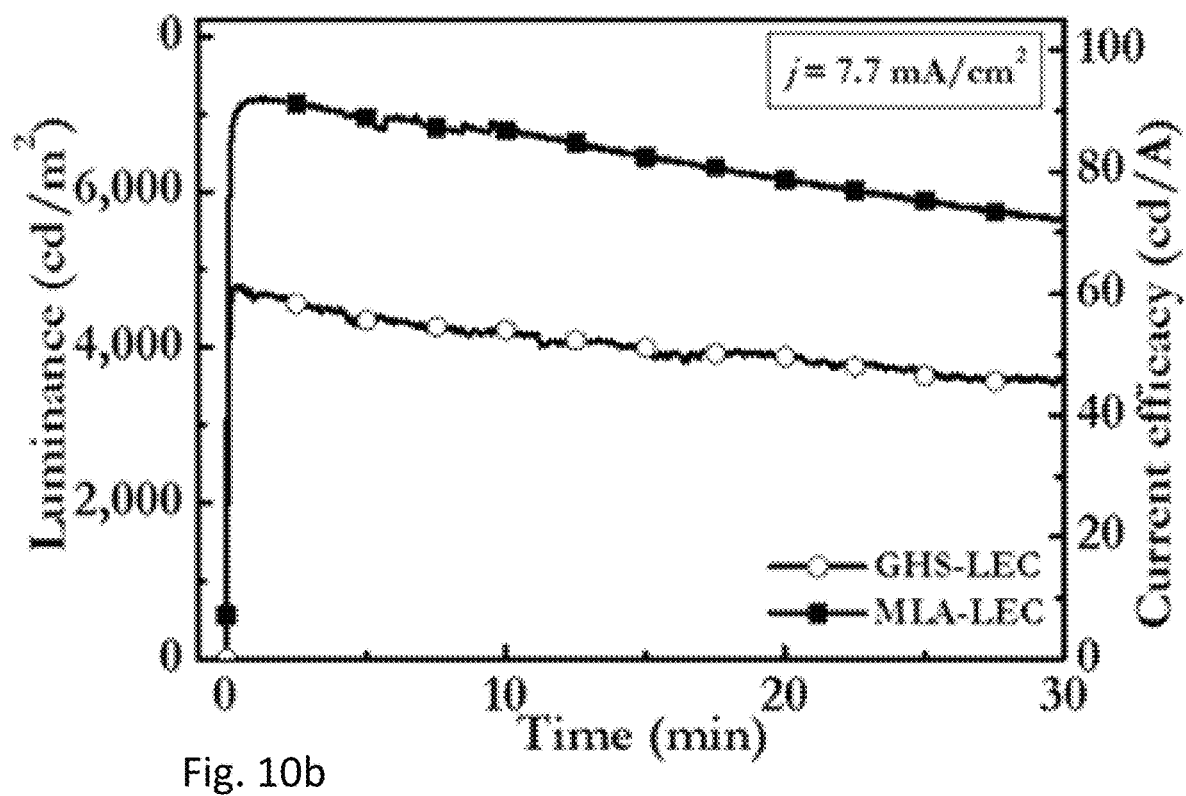
FIG. 10*b* shows the initial temporal evolution of the luminance and the current efficacy of the GHS-LEC (open circles) and the MLA-LEC (closed squares).

A significant fraction of the photons are trapped within the planar device structure by total internal reflection, and in order to access these photons two different outcoupling structures were attached onto the transparent substrate: (i) a flexible thin film comprising a hexagonal array of hemispherical microlenses as the surface structure (MLA-LEC), and (ii) an index-matched glass half-sphere (GHS-LEC). The transient optoelectronic response is presented in FIG. 9e, and with the MLA-LEC a current efficacy of 66.8 cd/A at 1,285 cd/m² was measured and with the GHS-LEC, 99.2 cd/A at 1,910 cd/m² was reached. The latter corresponds to an impressive external quantum efficiency of 27.5%. For the same device a stress lifetime of 320 h above 100 cd/m² was measured in FIG. 10a. The corresponding data at a higher current density of j=7.7 mA/cm² are presented in FIG. 10b, and the GHS-LEC delivered a strong luminance of 7,200 cd/m² at a retained high efficiency of 92.8 cd/A.

Figure 9F:
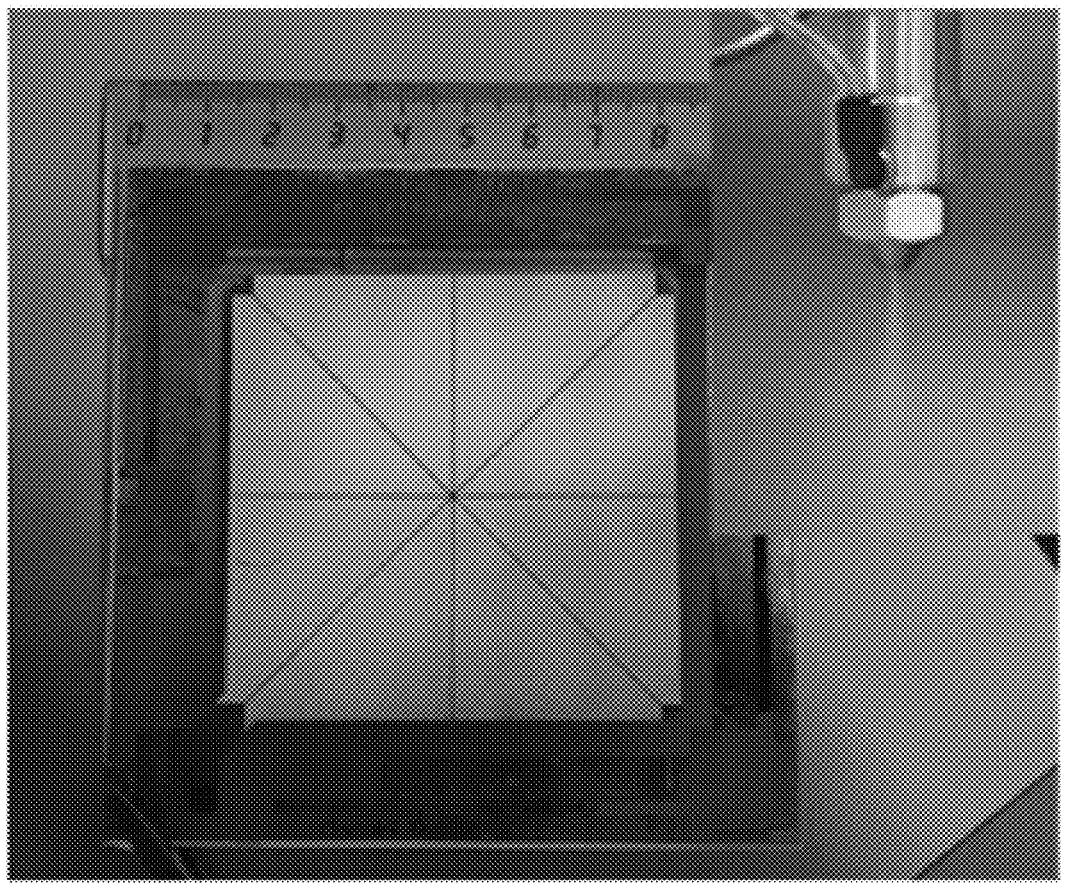
FIG. 9f shows the uniform green light-emission from a 45 $cm^2$ large-area host-guest LEC fabricated by spray-sintering under ambient air. Inset: photograph depicting the airbrush performing spray-sintering.

All devices up to this stage have featured a small light-emission area of <0.2 cm² as fabricated by spin-coating, but also large emission-area LECs were fabricated by more scalable spray-coating (or more specifically "spray-sintering") using an in-house developed automated spray-coating apparatus. The photograph in FIG. 9f shows the uniform green light-emission from such a 45 cm² large-area host-guest LEC, with its 350 nm thick active material deposited by spray-sintering under ambient air, as displayed in the inset photograph. The large-area LEC device was driven with a constant current density of j=1.1 mA/cm², and delivered a luminance of 150 cd/m² at a current efficacy of 13 cd/A, despite being void of an outcoupling structure. This result indicates that the introduced approach to high-efficiency, high-luminance LEC operation is relevant also for practical low-cost and/or large-area device configurations, and as such could pave the way for a wide range of novel and important applications in, for instance, home health care and portable signage where high-brightness operation at low energy consumption and low cost can be a fundamental criterion.

The invention claimed is:

1. A light-emitting electrochemical cell comprising:
    a first electrode;
    a second electrode; and
    at least one light-emitting active material separating the first and second electrodes, wherein the light-emitting active material comprises a combination of an electrolyte, a first constituent comprising a host compound and a second constituent comprising a guest compound, wherein:
        a quotient between a difference in LUMO energy level between the first and second constituent, $E_{trap}^n$, and a difference in HOMO energy level between the second and first constituent, $E_{trap}^p$, is 1/10 to 10;
        a quotient between an electron mobility and a hole mobility on the first constituent is 1/100 to 100;
        a quotient between a number of ions of the electrolyte and a number of molecules or repeat units of the second constituent is 1/3 to 5; and
        a LUMO energy level of the electrolyte is higher than the LUMO energy level of the first constituent and a HOMO energy level of the electrolyte is lower than the HOMO energy level of the first constituent.

2. The light-emitting electrochemical cell of claim 1, wherein the quotient between the difference in LUMO energy between the first and second constituent and the difference in HOMO energy between the second and first constituent of the light-emitting active material is 1/9 to 9.

3. The light-emitting electrochemical cell of claim 1, wherein the quotient between the electron mobility and the hole mobility on the first constituent in the light-emitting active material is 1/50 to 50.

4. The light-emitting electrochemical cell of claim 1, wherein the quotient between the number of ions of the electrolyte and the number of molecules or repeat units of the second constituent is 0.5 to 4.

5. The light-emitting electrochemical cell of claim 1, wherein a difference in energy gap, i.e. a difference between the LUMO energy level and the HOMO energy level, between the first and second constituent is 0.1 eV-1.5 eV.

6. The light-emitting electrochemical cell of claim 1, wherein a quotient between the number of molecules or repeat units of the first constituent and the number of molecules or repeat units of the second constituent is in a range between 300 and 1.

7. The light-emitting electrochemical cell of claim 1, wherein a thickness of the light-emitting active material layer is 50-2000 nm.

8. The light-emitting electrochemical cell of claim 1, wherein the first constituent of the light-emitting active material comprises at least one solution-processable semiconductor.

9. The light-emitting electrochemical cell of claim 8, wherein the at least one solution-processable semiconductor is selected from a group comprising polymers, oligomers, small molecules, and neutral and ionic transition metal complexes.

10. The light-emitting electrochemical cell of claim 1, wherein the second constituent of the light-emitting active material comprises at least one emissive solution-processable semiconductor.

11. The light-emitting electrochemical cell of claim 10, wherein the at least one emissive solution-processable semiconductor features triplet emission and is selected from a group comprising neutral and ionic transition metal complexes, quantum dots, polymers, oligomers, and small molecules.

12. The light-emitting electrochemical cell of claim 1, wherein the electrolyte is selected from a group comprising ionic liquids, salts dissolved in an ion-solvating material, and ionic transition metal complexes.

13. The light-emitting electrochemical cell of claim 1, wherein one or both of the first and second electrodes is transparent or semitransparent.

14. The light-emitting electrochemical cell of claim 13, wherein one or both of the first and second electrodes is coated with one or more layers of a material or materials selected from a group comprising poly(3,4-etylenedioxythiophene)-poly(styrene sulfonate) (PEDOT:PSS), ZnO and graphene.

15. The light-emitting electrochemical cell of claim 1, wherein the first constituent consists of one or two host compounds.

16. The light-emitting electrochemical cell of claim 1, wherein the second constituent consists of one guest compound.

17. A method of operating a light-emitting electrochemical cell of claim 1 by providing a voltage over the electrodes of the light-emitting electrochemical cell.

18. A method of operating a light-emitting electrochemical cell of claim 17 by providing the voltage at a value sufficient to achieve a current density of 0.1 to 5000 A/m².

19. The method of claim 17, wherein an external quantum efficiency of the light-emitting electrochemical cell, void of an outcoupling film or structure, is larger than 2%.

20. The method of claim 17, wherein more than 50% of photons emitted from the light-emitting electrochemical cell are emitted from the second constituent.

21. A method for producing a light-emitting electrochemical cell, comprising:
    providing a substrate;
    providing a first electrode on the substrate;
    providing at least one light-emitting active material layer on the first electrode; and
    providing a second electrode on the active material layer, wherein:
    the light-emitting active material layer comprises a combination of an electrolyte, a first constituent and a second constituent, wherein a quotient between a difference in LUMO energy level between the first and second constituent, $E_{trap}^{n}$, and a difference in HOMO energy level between the second and first constituent, $E_{trap}^{p}$, is 1/10 to 10:
    a quotient between electron mobility and hole mobility on the first constituent is 1/100 to 100;
    a quotient between the number of ions of the electrolyte and the number of molecules or repeat units of the second constituent is 1/3 to 5; and
    a LUMO energy level of the electrolyte is higher than the LUMO energy level of the first constituent and a HOMO energy level of the electrolyte is below the HOMO energy level of the first constituent.

22. The method of claim 21, wherein the light-emitting active material layer is provided on the first electrode by solution processing under an ambient air pressure of at least about 1 kPa.

23. The method of claim 21, wherein the light-emitting active material layer is provided on the first electrode by spray-coating.

24. The method of claim 21, further comprising a step of providing one or more layers between an electrode and the light-emitting active material layer in the light-emitting electrochemical cell, wherein the material or materials of the at least one layer is selected from a group comprising poly(3,4-etylenedioxythiophene)-poly(styrene sulfonate), ZnO and graphene.

25. The method of claim 21, further comprising a step of encapsulating the light-emitting electrochemical cell so that oxygen and water penetration into the active material layer is reduced.

26. The method of claim 21, further comprising a step of introducing an outcoupling film or structure to increase light output from the light-emitting electrochemical cell.

* * * * *

UNITED STATES PATENT AND TRADEMARK OFFICE
CERTIFICATE OF CORRECTION

| | | |
|---|---|---|
| PATENT NO. | : 10,892,434 B2 | Page 1 of 1 |
| APPLICATION NO. | : 16/477879 | |
| DATED | : January 12, 2021 | |
| INVENTOR(S) | : Edman et al. | |

It is certified that error appears in the above-identified patent and that said Letters Patent is hereby corrected as shown below:

In the Specification

Column 10, Lines 29-30, "ITO/PEDOT:PSS/PVK:OXD-7:Ir(R-ppy)$_3$:THABF$_4$/Al" should read
-- ITO/PEDOT:PSS/PVK:OXD-7:Ir(R-ppy)$_3$:THABF$_4$/Al --.

Column 10, Lines 44-45, "ITO/PEDOT:PSS/PVK:OXD-7:Ir(R-ppy)$_3$:THABF$_4$/Al" should read
-- ITO/PEDOT:PSS/PVK:OXD-7:Ir(R-ppy)$_3$:THABF$_4$/Al --.

Signed and Sealed this
Eighth Day of June, 2021

Drew Hirshfeld
*Performing the Functions and Duties of the*
*Under Secretary of Commerce for Intellectual Property and*
*Director of the United States Patent and Trademark Office*